US008951849B2

(12) United States Patent
Takayama et al.

(10) Patent No.: US 8,951,849 B2
(45) Date of Patent: Feb. 10, 2015

(54) METHOD FOR MANUFACTURING SEMICONDUCTOR DEVICE INCLUDING LAYER CONTAINING YTTRIA-STABILIZED ZIRCONIA

(75) Inventors: Toru Takayama, Kanagawa (JP); Kengo Akimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 334 days.

(21) Appl. No.: 13/050,002

(22) Filed: Mar. 17, 2011

(65) Prior Publication Data
US 2011/0165740 A1 Jul. 7, 2011

Related U.S. Application Data

(62) Division of application No. 12/335,234, filed on Dec. 15, 2008, now Pat. No. 7,910,929.

(30) Foreign Application Priority Data

Dec. 18, 2007 (JP) ................................ 2007-325708

(51) Int. Cl.
*H01L 35/24* (2006.01)
*H01L 21/3105* (2006.01)
(Continued)

(52) U.S. Cl.
CPC ...... *H01L 21/3105* (2013.01); *H01L 21/31604* (2013.01); *H01L 21/32055* (2013.01); *H01L 29/4908* (2013.01); *H01L 29/66765* (2013.01);
(Continued)

(58) Field of Classification Search
USPC .............. 257/55, 65, E29.151, E51.005; 438/149, 158, 482
See application file for complete search history.

(56) References Cited

U.S. PATENT DOCUMENTS

| 4,409,134 A | 10/1983 | Yamazaki |
| 5,358,925 A | 10/1994 | Neville et al. |

(Continued)

FOREIGN PATENT DOCUMENTS

| EP | 0473988 A1 | 3/1992 |
| EP | 1209729 A1 | 5/2002 |

(Continued)

OTHER PUBLICATIONS

Ohta et al., "Highly electrically conductive indium—tin—oxide thin films epitaxially grown on yttria-stabilized zirconia (100) by pulsed-laser deposition", Appl. Phys. Lett. 76, 2740 (2000).*

(Continued)

*Primary Examiner* — Thomas L Dickey
(74) *Attorney, Agent, or Firm* — Fish & Richardson P.C.

(57) ABSTRACT

An object is to provide a semiconductor device including a microcrystalline semiconductor film with favorable quality and a method for manufacturing the semiconductor device. In a thin film transistor formed using a microcrystalline semiconductor film, yttria-stabilized zirconia having a fluorite structure is formed in the uppermost layer of a gate insulating film in order to improve quality of a microcrystalline semiconductor film to be formed in the initial stage of deposition. The microcrystalline semiconductor film is deposited on the yttria-stabilized zirconia, so that the microcrystalline semiconductor film around an interface with a base particularly has favorable crystallinity while by crystallinity of the base.

12 Claims, 36 Drawing Sheets

(51) Int. Cl.
*H01L 21/316* (2006.01)
*H01L 21/3205* (2006.01)
*H01L 29/49* (2006.01)
*H01L 29/66* (2006.01)
*H01L 29/786* (2006.01)
*H01L 29/417* (2006.01)

(52) U.S. Cl.
CPC ..... *H01L 29/78696* (2013.01); *H01L 29/41733* (2013.01)
USPC ...................................................... 438/158

(56) References Cited

U.S. PATENT DOCUMENTS

| | | | |
|---|---|---|---|
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,648,293 A | 7/1997 | Hayama et al. | |
| 5,648,662 A | 7/1997 | Zhang et al. | |
| 5,693,238 A | 12/1997 | Schmitt et al. | |
| 5,701,167 A | 12/1997 | Yamazaki | |
| 5,766,989 A | 6/1998 | Maegawa et al. | |
| 5,811,328 A | 9/1998 | Zhang et al. | |
| 5,849,601 A | 12/1998 | Yamazaki | |
| 5,859,445 A | 1/1999 | Yamazaki | |
| 6,011,277 A | 1/2000 | Yamazaki | |
| 6,023,075 A | 2/2000 | Yamazaki | |
| 6,124,155 A | 9/2000 | Zhang et al. | |
| 6,166,399 A | 12/2000 | Zhang et al. | |
| 6,232,242 B1 | 5/2001 | Hata et al. | |
| 6,252,249 B1 | 6/2001 | Yamazaki | |
| 6,296,735 B1 | 10/2001 | Marxer et al. | |
| 6,306,213 B1 | 10/2001 | Yamazaki | |
| 6,335,213 B1 | 1/2002 | Zhang et al. | |
| 6,528,816 B1 | 3/2003 | Jackson et al. | |
| 6,533,534 B2 | 3/2003 | Schmitt et al. | |
| 6,673,255 B2 | 1/2004 | Marxer et al. | |
| 6,683,012 B2 | 1/2004 | Hata et al. | |
| 6,756,258 B2 | 6/2004 | Zhang et al. | |
| 6,797,548 B2 | 9/2004 | Zhang et al. | |
| 6,847,064 B2 | 1/2005 | Zhang et al. | |
| 7,015,507 B2 | 3/2006 | Yonehara et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 2001/0039107 A1* | 11/2001 | Suguro | 438/585 |
| 2002/0016029 A1* | 2/2002 | Kawakita et al. | 438/156 |
| 2002/0127887 A1* | 9/2002 | Uehara et al. | 438/800 |
| 2004/0224459 A1 | 11/2004 | Nishikawa | |
| 2005/0012097 A1 | 1/2005 | Yamazaki | |
| 2005/0017243 A1 | 1/2005 | Zhang et al. | |
| 2005/0130389 A1* | 6/2005 | Yamazaki et al. | 438/455 |
| 2005/0151156 A1* | 7/2005 | Wu et al. | 257/107 |
| 2005/0170643 A1* | 8/2005 | Fujii et al. | 438/637 |
| 2005/0218456 A1* | 10/2005 | Kondo et al. | 257/368 |
| 2006/0105514 A1* | 5/2006 | Yamazaki et al. | 438/197 |
| 2006/0231882 A1* | 10/2006 | Kim et al. | 257/310 |
| 2007/0018165 A1 | 1/2007 | Yamazaki | |
| 2008/0044962 A1 | 2/2008 | Zhang et al. | |
| 2008/0108226 A1* | 5/2008 | Oh et al. | 438/762 |
| 2009/0148970 A1* | 6/2009 | Hosoya et al. | 438/29 |

FOREIGN PATENT DOCUMENTS

| | | |
|---|---|---|
| JP | 60-098680 A | 6/1985 |
| JP | 61-087371 A | 5/1986 |
| JP | 01-181512 A | 7/1989 |
| JP | 04-242724 A | 8/1992 |
| JP | 05036610 A | 2/1993 |
| JP | 05-109629 A | 4/1993 |
| JP | 05109629 A | 4/1993 |
| JP | 06-045354 A | 2/1994 |
| JP | 06-077483 A | 3/1994 |
| JP | 06-346245 A | 12/1994 |
| JP | 07-045833 A | 2/1995 |
| JP | 08-195492 A | 7/1996 |
| JP | 10163502 A | 6/1998 |
| JP | 11-121761 A | 4/1999 |
| JP | 2001077112 A | 3/2001 |
| JP | 2001217424 A | 8/2001 |
| JP | 2002-246605 A | 8/2002 |
| JP | 2002319678 A | 10/2002 |
| JP | 2005005509 A | 1/2005 |
| JP | 2005-049832 A | 2/2005 |
| JP | 2005-167051 A | 6/2005 |
| JP | 2005-203638 A | 7/2005 |
| JP | 2007-005508 A | 1/2007 |
| JP | 2007-035964 A | 2/2007 |

OTHER PUBLICATIONS

Hyun Jung Lee et al.; "Leakage current mechanisms in top-gate nanocrystalline silicon thin film transistors"; Applied Physics Letters, vol. 92, pp. 083509-1-083509-3; 2008.

Mohammad R. Esmaeili-Rad et al.; "Absence of defect state creation in nanocrystalline silicon thin film transistors deduced from constant current stress measurements"; Applied Physics Letters, vol. 91; pp. 113511-1-113511-3; 2007.

Czang-Ho Lee et al.; "Stability of nc-Si:H TFTs With Silicon Nitride Gate Dielectric"; IEEE Transactions on Electron Devices, vol. 54, No. 1; pp. 45-51; Jan. 1, 2007.

Andrei Sazonov et al.; "Low-Temperature Materials and Thin Film Transistors for Flexible Electronics"; Proceedings of the IEEE, vol. 93, No. 8; pp. 1420-1428; Aug. 2005.

Mohammad R. Esmaeili-Rad et al.; "Stability of nanocrystalline silicon bottom-gate thin film transistors with silicon nitride gate dielectric"; Journal of Applied Physics, vol. 102; pp. 064512-1-064512-7; 2007.

Czang-Ho Lee et al.; "Top-Gate TFTs Using 13.56 MHz PECVD Microcrystalline Silicon"; IEEE Electron Device Letters, vol. 26, No. 9; pp. 637-639; Sep. 5, 2005.

Czang-Ho Lee et al.; "Postdeposition thermal annealing and material stability of 75°C hydrogenated nanocrystalline silicon plasma-enhanced chemical vapor deposition films"; Journal of Applied Physics, vol. 98; pp. 034305-1-034305-7; Aug. 4, 2005.

Czang-Ho Lee et al.; "High-mobility nanocrystalline silicon thin-film transistors fabricated by plasma-enhanced chemical vapor deposition"; Applied Physics Letters, vol. 86; pp. 222106-1-222106-3; May 24, 2005.

Czang-Ho Lee et al.; "High Mobility N-Channel and P-Channel Nanocrystalline Silicon Thin-Film Transistors"; IEDM 05: Technical Digest of International Electron Devices Meeting; pp. 937-940; 2005.

Czang-Ho Lee et al.; "Directly deposited nanocrystalline silicon thin-film transistors with ultra high mobilities"; Applied Physics Letters, vol. 89; pp. 252101-1-252101-3; Dec. 18, 2006.

C.-H Lee et al.; "How to Achieve High Mobility Thin Film Transistors by Direct Deposition of Silicon Using 13.56 MHz RF PECVD?"; IEDM; pp. 295-298; 2006.

Mohammad R. Esmaeili-Rad et al., "High Stability, Low Leakage Nanocrystalline Silicon Bottom Gate Thin Film Transistors for AMOLED Displays"; IEEE-IEDM; pp. 303-306; 2006.

Yoshiaki Arai et al.; "41.2: Micro Silicon Technology for Active Matrix OLED Display"; SID 07 Digest: SID International Symposium Digest of Technical Papers, vol. XXXVIII, pp. 1370-1373; 2007.

* cited by examiner

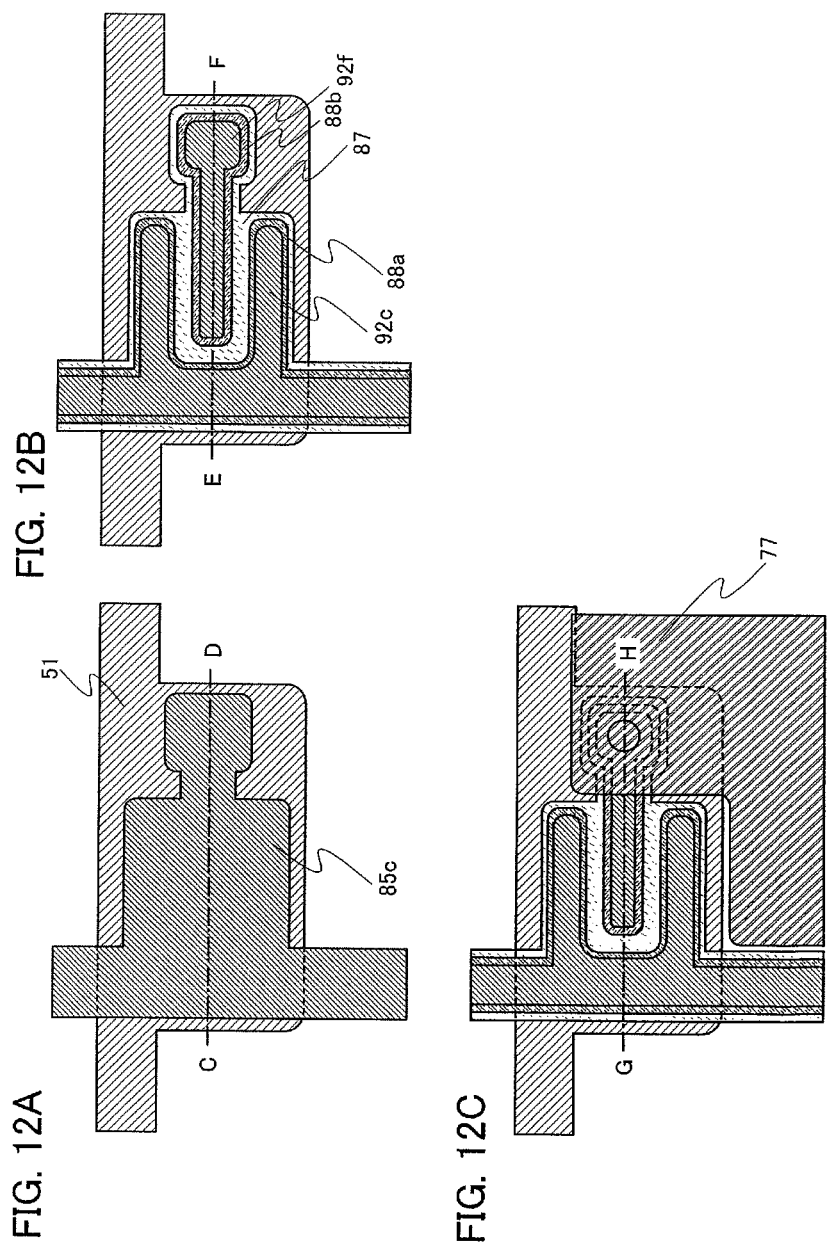

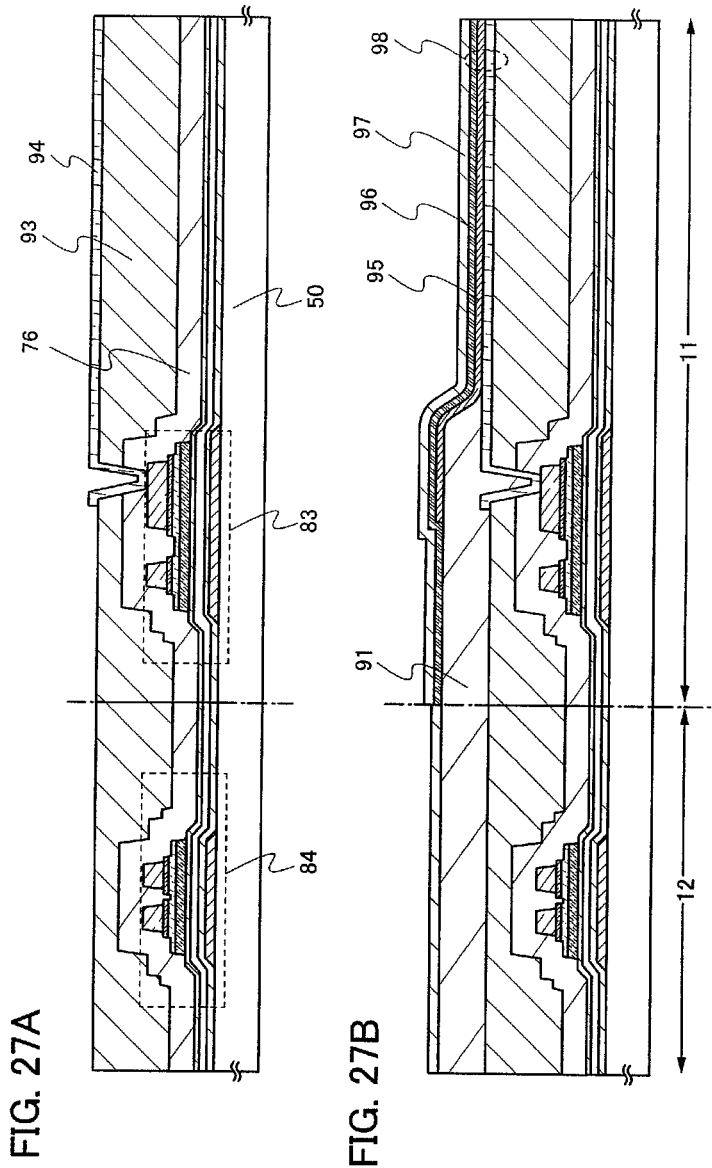

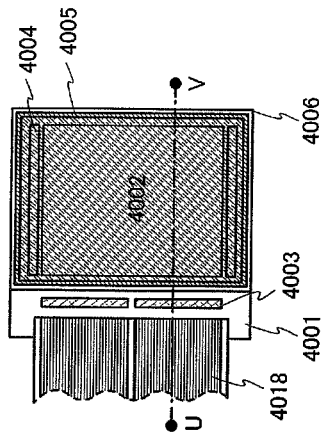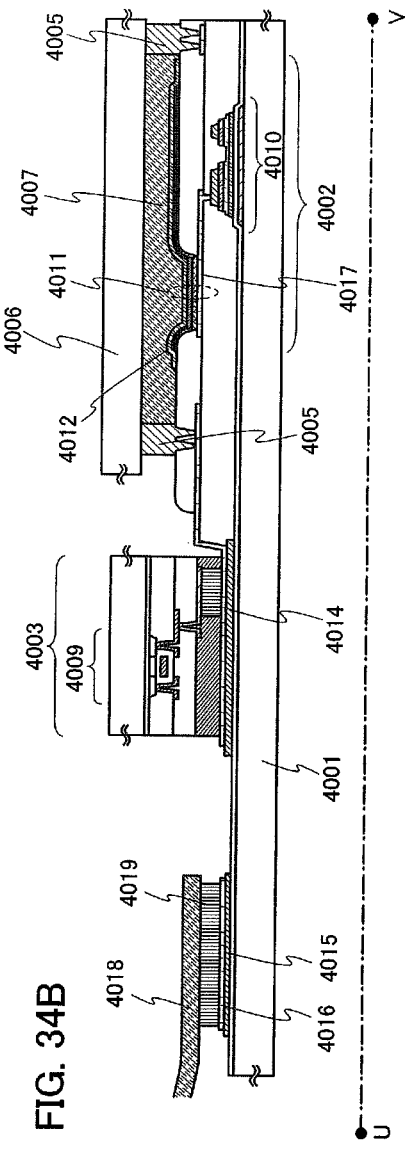
FIG. 34A
FIG. 34B

METHOD FOR MANUFACTURING SEMICONDUCTOR DEVICE INCLUDING LAYER CONTAINING YTTRIA-STABILIZED ZIRCONIA

CROSS-REFERENCE TO RELATED APPLICATIONS

This application is a divisional of U.S. application Ser. No. 12/335,234, filed Dec. 15, 2008, now allowed, which claims the benefit of a foreign priority application filed in Japan as Serial No. 2007-325708 on Dec. 18, 2007, both of which are incorporated by reference.

BACKGROUND OF THE INVENTION

1. Field of the Invention

The present invention relates to a semiconductor device having a circuit which includes a thin film transistor, and a method for manufacturing the semiconductor device. For example, the present invention relates to an electronic appliance on which a light-emitting display device including an organic light-emitting element or an electro-optic device typified by a liquid crystal display panel is mounted as a component.

Note that the term "semiconductor device" in this specification refers to a device in general that can operate by utilizing semiconductor characteristics, and an image display device, an electro-optic device, a semiconductor circuit, and an electronic appliance are all included in the semiconductor device.

2. Description of the Related Art

In recent years, a technique for forming thin film transistors (TFTs) each using a semiconductor thin film (a thickness of several nm to several hundred nm) formed over a substrate having an insulating surface has attracted attention. The thin film transistors are widely applied to electronic devices such as ICs and electro-optic devices and are particularly expected to be rapidly developed as switching elements of image display devices.

For a switching element in an image display device, a thin film transistor using an amorphous semiconductor film, a thin film transistor using a polycrystalline semiconductor film, or the like is used.

In the case of a thin film transistor using an amorphous semiconductor film, an amorphous semiconductor film such as a hydrogenated amorphous silicon film is used; therefore, there is limitation on the process temperature and heating at a temperature of 400° C. or higher at which hydrogen is desorbed from the film, intense laser light irradiation by which surface roughness is caused due to hydrogen in the film, and the like are not performed. The hydrogenated amorphous silicon film is an amorphous silicon film whose electric characteristics are improved by bonding of hydrogen to dangling bonds and disappearance of the dangling bonds as a result.

A thin film transistor using a polycrystalline semiconductor film has an advantage that mobility is higher than that of a thin film transistor using an amorphous semiconductor film by two or more digits, and a pixel portion and a peripheral driver circuit of a display device can be formed over one substrate. However, because of crystallization of a semiconductor film, steps of a thin film transistor using a polycrystalline semiconductor film are more complicated than steps of a thin film transistor using an amorphous semiconductor film. Therefore, there occurs a problem in that yield is reduced and cost is increased.

Patent Document 1 (U.S. Pat. No. 5,591,987) discloses a FET (field effect transistor) in which a channel formation region is formed of a semiconductor having a mixture of a crystal structure and an amorphous structure.

Further, as a switching element in an image display device, a thin film transistor using a microcrystalline semiconductor film is used (Patent Document 2: Japanese Published Patent Application No. H4-242724 and Patent Document 3: Japanese Published Patent Application No. 2005-49832).

SUMMARY OF THE INVENTION

As a method for forming a microcrystalline semiconductor film, a deposition method using a plasma CVD method can be adopted. By this method, a silane gas is diluted with hydrogen so that a microcrystalline semiconductor film can be formed. However, by dilution with hydrogen, a deposition rate of the microcrystalline semiconductor film decreases.

In an inverted-staggered thin film transistor in which a semiconductor layer is provided over a gate electrode with a gate insulating film interposed therebetween, a semiconductor region which is formed in the initial stage of deposition is used as a channel formation region. Accordingly, the higher the quality of the semiconductor region which is formed in the initial stage of deposition is, the more excellent the electric characteristics such as field effect mobility of a thin film transistor are.

However, when a hydrogen concentration is reduced in order to increase a deposition rate of a microcrystalline semiconductor film, a region of the semiconductor layer, which is to be a channel formation region, may possibly be an amorphous region.

An object of the present invention is to provide a semiconductor device including a microcrystalline semiconductor film with favorable quality and a method for manufacturing the semiconductor device. Another object of the present invention is to provide a semiconductor device using a thin film transistor whose field effect mobility is higher than that of a thin film transistor using an amorphous silicon film and a method for manufacturing the semiconductor device.

According to an aspect of the present invention, in order to form a microcrystalline semiconductor film having favorable quality, in a semiconductor device, a material having a crystal lattice constant close to that specific to silicon is applied to a gate insulating film in contact with the microcrystalline semiconductor film.

In specific, in a semiconductor device of the present invention, a film containing yttria and zirconia is formed in the uppermost layer of a gate insulating film. Further, a microcrystalline semiconductor film is formed over the film.

In the semiconductor device of the present invention, the microcrystalline semiconductor film is formed on a surface of the film containing yttria and zirconia, which is part of the gate insulating film, so that crystal growth specific to silicon can be promoted.

In the crystal structure of zirconia, a monoclinic system exists stably at a room temperature but the crystal structure is changed to a tetragonal system or a cubic system as the temperature rises. In addition, it is known that the fluorite structure of a cubic system exists stably even at a room temperature when yttria or the like is added to zirconia as appropriate.

A film formed of a material in which yttria contained at 43 mol % or less and zirconia are mixed is referred to as a YSZ film (yttria-stabilized zirconia) in this specification. It is to be noted that a YSZ film necessarily contains both yttria and zirconia. Hereinafter, when zirconia is described, it is distinguished from YSZ.

YSZ has the fluorite structure of a cubic system. For example, YSZ obtained by adding 8 mol % of yttria to zirconia has a fluorite structure in which a lattice constant α is 0.514 nm. This approximates the crystal lattice constant specific to silicon of 0.543 nm, and silicon on a YSZ film is affected by the crystal structure of the base and thus easily crystallized in a manner specific to silicon. Silicon provided above is easily crystallized in a manner specific to silicon in the case where a YSZ film is used as a base as compared to the case where silicon oxide, silicon nitride, silicon oxynitride, or silicon nitride oxide is formed as a base because those, which are generally used, do not have crystal structures.

A material having a crystal structure and a lattice constant which are equivalent to those of a YSZ film also has an effect that a silicon layer provided thereover easily crystallized in a manner specific to silicon similarly to YSZ. In other words, an aspect of the present invention is to use a material having a crystal structure and a lattice constant which are equivalent to those of a YSZ film for a gate insulating film in contact with a semiconductor film. Hereinafter, the case where a YSZ film is used as a gate insulating film and the case where a material whose lattice constant approximates a crystal lattice constant specific to silicon is used yield similar effective results.

Note that a YSZ film may be provided in the uppermost layer of a gate insulating film. That is, the gate insulating film may have a layered structure including two or more layers and in this case, there is no particular limitation on the kind of a film below the YSZ film. For example, as a lower layer of the gate insulating film having the layered structure in which the YSZ film is in the uppermost layer, one or more of a silicon oxide film, a silicon nitride film, a silicon oxynitride film, and a silicon nitride oxide film can be applied. Alternatively, the gate insulating film may be a single YSZ film. When the YSZ film is in the uppermost layer, a silicon film formed on the YSZ film is in contact with the YSZ film. That is, crystallization specific to silicon is easily performed and thus improvement in quality of a semiconductor region formed in the initial stage of deposition, which is an object of the present invention, can be achieved.

Further, to make a lattice constant small by adding germanium to silicon with high purity in order to promote crystallization of silicon is also an aspect of the present invention. For that purpose, germane may be added as one of plasma CVD deposition gases when a microcrystalline semiconductor film is formed.

Further, to perform plasma treatment on a surface of a YSZ film before a microcrystalline semiconductor film is formed, in order to promote crystallization of silicon, is also an aspect of the present invention. $H_2$, $O_2$, an inert gas such as Ar or $N_2$, or a combination of any of the above is used for the plasma treatment. After the YSZ film is formed, reverse sputtering treatment is preferably performed using $H_2$, $O_2$, Ar, $N_2$, or the like.

Here, a microcrystalline semiconductor film refers to a film including a semiconductor having a structure intermediate between an amorphous structure and a crystal structure (including a single crystal structure and a polycrystalline structure). This semiconductor has a third state which is stable in terms of free energy and is a crystalline semiconductor which has short-range order and lattice distortion, and column-like or needle-like crystals with its grains with a size of 0.5 to 20 nm grown in the direction of a normal line with respect to the surface of the substrate. Further, a microcrystalline semiconductor and an amorphous semiconductor are mixed. A peak of the Raman spectrum of a microcrystalline silicon which is a typical example of a microcrystalline semiconductor is shifted toward lower wavenumber than 520 cm$^{-1}$ which represents the peak of the Raman spectrum of single crystal silicon. That is, a peak of the Raman spectrum of microcrystalline silicon lies between 520 cm$^{-1}$ which represents that of single crystal silicon, and 480 cm$^{-1}$ which represents that of amorphous silicon.

A buffer layer formed of an amorphous semiconductor layer is formed over such a microcrystalline semiconductor film and a source electrode, a drain electrode, and a source region and a drain region which are formed using a semiconductor film to which an impurity element imparting one conductivity type is added are formed over the buffer layer, so that a thin film transistor is formed.

The buffer layer may be formed in the reaction chamber in which the microcrystalline semiconductor film is formed. When the buffer layer is formed in the same reaction chamber as the microcrystalline semiconductor film, an interface between the layers can be formed without being contaminated with contaminating impurity elements, which is floating when the substrate is carried; thus, variations in characteristics of the thin film transistor can be reduced.

Further, the source electrode and the drain electrode are formed over the buffer layer, and a depressed portion is formed in the buffer layer in order to reduce the amount of leak current between the source electrode and the drain electrode.

Further, a semiconductor film containing an n-type impurity element (n+ layer) is provided between the buffer layer and each of the source electrode and the drain electrode. Further, the buffer layer is provided between the n+ layer and the microcrystalline semiconductor film so as to prevent contact therebetween. Therefore, the n+ layer, the buffer layer, and the microcrystalline semiconductor film are overlapped below the source electrode. Similarly, the n+ layer, the buffer layer, and the microcrystalline semiconductor film are overlapped below the drain electrode. Such a layered structure is adopted and the buffer layer is formed thick, so that a withstand voltage of the thin film transistor can be improved. Further, in the case where the buffer layer is formed thick, a depressed portion can be formed in part of the buffer layer without exposing the microcrystalline semiconductor film which is easily oxidized.

After the above manufacturing process, further, a semiconductor film containing an n-type impurity element is formed over the buffer layer, a source electrode and a drain electrode are formed over the semiconductor film containing an n-type impurity element, the semiconductor film containing an n-type impurity element is etched to form a source region and a drain region, and part of the buffer layer is etched to be removed such that regions overlapping with the source region and the drain region are left, so that a thin film transistor is formed.

Although one desirable mode of forming a buffer layer is described here, even the case in which a buffer layer is not provided produces an effect that crystallinity of a microcrystalline semiconductor film is improved with a YSZ film used for a base.

Further, a relative dielectric constant of a YSZ film is approximately 20 and higher than those of silicon oxide, silicon nitride, silicon oxynitride, and silicon nitride oxide. Therefore, an effect that the effective thickness of a gate insulating film is reduced can be obtained.

The thin film transistor thus obtained includes a channel formation region having excellent crystallinity around an interface with the gate insulating film. Therefore, when the thin film transistor is on, an on current and mobility are increased. Further, an off current is suppressed because the buffer layer formed of an amorphous semiconductor film is provided over the microcrystalline semiconductor film. As a result, the thin film transistor of the present invention has excellent switching characteristics, which leads to improvement in contrast of a display panel.

Since the source and the drain of the transistor in this specification are changed depending on the structure, the operating conditions, or the like of the transistor, it is difficult to define which is a source and which is a drain. Therefore, in this specification, one electrode which is arbitrarily selected from a source electrode and a drain electrode is referred to as one of the source electrode and the drain electrode, whereas the other electrode is referred to as the other of the source electrode and the drain electrode. Similarly, one region which is arbitrarily selected from a source region and a drain region is referred to as one of the source region and the drain region, whereas the other region is referred to as the other of the source region and the drain region.

The thin film transistor using a YSZ film of the present invention has current-voltage characteristics represented by a curve with a steep slope in a rising portion, has excellent responsiveness as a switching element, and can be operated at high speed.

In the case of a light-emitting device using a thin film transistor using the YSZ film of the present invention, fluctuation in threshold of the thin film transistor can be reduced, which leads to improvement in reliability.

Further, in the case of a liquid crystal display device using the thin film transistor obtained by the manufacturing method of the present invention, field effect mobility can be increased and thus, the driving frequency of a driver circuit can be increased. Since the driver circuit can be operated at high speed, a frame frequency can be quadruplicated or black frames can be inserted.

BRIEF DESCRIPTION OF THE DRAWINGS

In the accompanying drawings:
FIGS. 12A to 12C are top views illustrating manufacturing steps of the present invention;
FIGS. 27A and 27B are cross-sectional views illustrating an example of a method for manufacturing a light-emitting device;
FIG. 34A is a top view illustrating a display panel and FIG. 34B is a cross-sectional view illustrating the display panel.

DETAILED DESCRIPTION OF THE INVENTION

The embodiment modes and embodiment of the present invention will be described below. However, the present invention can be carried out in many different modes, and it will be easily understood by those skilled in the art that various changes and modifications can be made to the modes and their details without departing from the spirit and scope of the present invention. Therefore, the present invention should not be construed as being limited to the description in the following embodiment modes and embodiment.

(Embodiment Mode 1)

In this embodiment mode, an example in which the present invention is applied to a manufacturing process of a thin film transistor used for a liquid crystal display device is described with reference to FIGS. 1A to 1C, FIGS. 2A to 2D, FIGS. 3A to 3C, FIG. 4, FIGS. 5A and 5B, and FIGS. 6A and 6B. FIGS. 1A to 1C, FIGS. 2A to 2D, FIGS. 3A to 3C, FIGS. 5A and 5B, and FIGS. 6A and 6B are cross-sectional views illustrating manufacturing steps of a thin film transistor. FIG. 4 is a top view of a region where a thin film transistor and a pixel electrode are connected in one pixel.

Figure 1A:
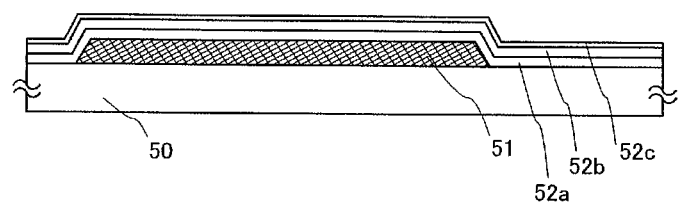
FIGS. 1A to 1C are cross-sectional views illustrating a manufacturing method of the present invention.

As illustrated in FIG. 1A, a gate electrode 51 is formed over a substrate 50 having an insulating surface. As the substrate 50 having an insulating surface, a non-alkaline glass substrate manufactured by a fusion method or a float method, such as a barium borosilicate glass substrate, an aluminoborosilicate glass substrate, or an aluminosilicate glass substrate, or the like can be used. When the substrate 50 having an insulating surface is a mother glass, any of the following sizes of the substrate can be used; the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

The gate electrode 51 is formed using a metal material such as titanium, molybdenum, chromium, tantalum, tungsten, or aluminum or an alloy material of any of the above. The gate electrode 51 can be formed as follows: a conductive film is formed over the substrate 50 having an insulating surface by a sputtering method or a vacuum evaporation method, a mask is formed over the conductive film by a photolithography technique or an inkjet method, and the conductive film is etched using the mask. Alternatively, the gate electrode 51 may be formed by discharging a conductive nanopaste of silver, gold, copper, or the like by an inkjet method and baking the conductive nanopaste. Note that, as barrier metal which improves adhesion of the gate electrode 51 and prevents diffusion to a base, a nitride film of the above metal material may be provided between the substrate 50 having an insulating surface and the gate electrode 51. Here, the gate electrode 51 is formed by etching the conductive film formed over the substrate 50 having an insulating surface with the use of a resist mask formed using a first photomask.

As a specific example of the structure of the gate electrode, a structure in which a molybdenum film is stacked on an aluminum film so that a hillock and electromigration which are specific to aluminum are prevented may be adopted. Alternatively, a three-layer structure in which an aluminum film is sandwiched between molybdenum films may be adopted. As other examples of the structure of the gate electrode, a layered structure in which a molybdenum film is stacked on a copper film, a layered structure in which a titanium nitride film is stacked on a copper film, and a layered structure in which a tantalum nitride film is stacked on a copper film are given.

Note that since a semiconductor film and a wiring are to be formed over the gate electrode 51, the gate electrode 51 is desirably processed so that end portions thereof are tapered for preventing disconnection. Further, although not illustrated, wirings connected to the gate electrode can also be formed concurrently with the gate electrode 51.

Then, gate insulating films 52a, 52b, and 52c are formed in this order over the gate electrode 51. A cross-sectional view of a thin film transistor after the steps up to the above corresponds to FIG. 1A.

Each of the gate insulating films 52a and 52b can be formed by a plasma CVD method, a sputtering method, or the like using a silicon oxide film, a silicon nitride film, a silicon oxynitride film, or a silicon nitride oxide film. In order to prevent an interlayer short circuit caused by a pinhole or the like formed in the gate insulating films, it is preferable to form plural layers using different insulating films. Further, a gate insulating film 52c is formed of a YSZ film. Here, a mode is described in which a silicon nitride film, a silicon oxynitride film, and a YSZ film are stacked in this order as the gate insulating films 52a, 52b, and 52c, respectively.

Here, a silicon oxynitride film refers to a film that contains more oxygen than nitrogen and contains oxygen, nitrogen, silicon, and hydrogen at given concentrations ranging from 55 to 65 atomic %, from 1 to 20 atomic %, from 25 to 35 atomic %, and from 0.1 to 10 atomic %, respectively, where the total percentage of atoms is 100 atomic %. Further, a silicon nitride oxide film refers to a film that contains more nitrogen than oxygen and contains oxygen, nitrogen, silicon, and hydrogen at given concentrations ranging from 15 to 30 atomic %, from 20 to 35 atomic %, from 25 to 35 atomic %, and from 15 to 25 atomic %, respectively, where the total percentage of atoms is 100 atomic %.

The gate insulating film 52a and the gate insulating film 52b are each formed to a thickness of larger than 50 nm. The gate insulating film 52a is preferably a silicon nitride film or a silicon nitride oxide film in order that diffusion of an impurity (such as alkali metal) from the substrate may be prevented. Further, the gate insulating film 52a can have a function of preventing hillock formation when the gate electrode is made of aluminum in addition to a function of preventing oxidation of the gate electrode.

The gate insulating film 52a and the gate insulating film 52b may be formed using a microwave plasma CVD apparatus which can introduce a microwave with a frequency of 1 GHz. A silicon oxynitride film and a silicon nitride oxide film which are formed by a microwave plasma CVD apparatus each have a high withstand voltage, so that reliability of a thin film transistor can be improved.

As the gate insulating film 52c, a YSZ film is formed by a sputtering method using a target in which yttria and zirconia are mixed at a ratio of 8 mol % to 92 mol % and a deposition gas of argon (Ar) and oxygen ($O_2$) at a deposition pressure of 0.4 Pa so that the film thickness is 10 to 20 nm, specifically 50 nm (see FIG. 1A). Note that the substrate temperature in deposition is preferably as high as possible, but may be at a room temperature in the present invention. Further, the YSZ film contains yttria at 20 mol % or less.

The YSZ film is excellent in heat resistance and chemical stability and its crystal easily grows in a specific crystal orientation. The relative dielectric constant of the YSZ film is approximately 20 and increased as the YSZ film is crystallized. Further, the YSZ film is an insulator. Since crystallinity does not vary so significantly within a range of the allowable temperature limit of glass, any temperature is suitable for the substrate temperature in deposition as long as it is within a range of a room temperature to the allowable temperature limit of glass.

Figure 5A:
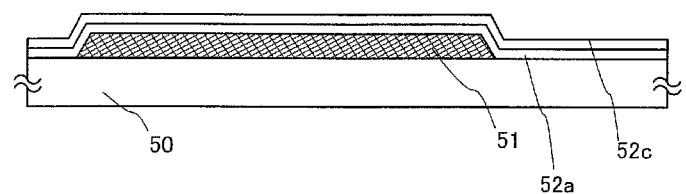
FIGS. 5A and 5B are cross-sectional views illustrating a manufacturing method of the present invention.
Figure 5B:
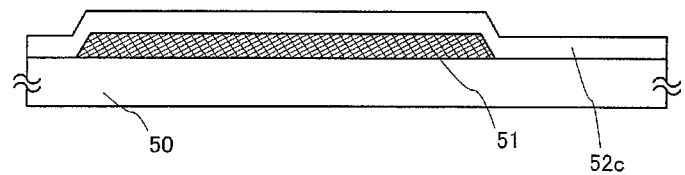

Here, the gate insulating film has a three-layer structure; however, in the case where it is used for a switching element of a liquid crystal display device for example, for AC drive, the gate insulating film may have a layered structure in which the gate insulating film 52a in the first layer may be any of a silicon oxide film, a silicon nitride film, a silicon oxynitride film, or a silicon nitride oxide film and the gate insulating film 52c in the second layer may be a YSZ film as illustrated in FIG. 5A, or may have a single-layer structure including only the gate insulating film 52c formed of a YSZ film as illustrated in FIG. 5B.

Here, a surface of the YSZ film may be activated and may be subjected to plasma treatment in order that a film to be formed in an upper layer may easily be affected by crystallinity of the YSZ film. For the plasma treatment, one of $H_2$, $O_2$, Ar, and $N_2$ or a combination of any of the above may be used and here, Ar plasma treatment is performed by a reverse sputtering method. After the YSZ film is formed, a voltage is applied in an Ar gas atmosphere at a pressure of 0.2 Pa so that the substrate serves as a cathode, and reverse sputtering treatment is performed under the condition that the YSZ film is not removed.

Figure 1B:
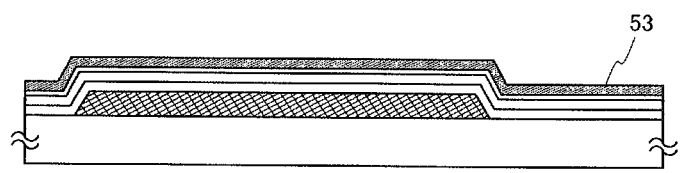
Figure 1C:
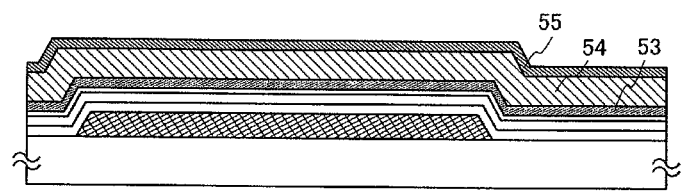

After the gate insulating film is formed, a microcrystalline semiconductor film 53 is formed as illustrated in FIG. 1B. The microcrystalline semiconductor film 53 is a film including a semiconductor having an intermediate structure between amorphous and crystal structures (including single-crystal and polycrystalline structures). This semiconductor is a semiconductor having a third condition that is stable in terms of free energy and is a crystalline substance having short-range order and lattice distortion, and column-like or needle-like crystals with a grain size, which is seen from the film surface, of 0.5 to 50 nm, preferably 1 to 20 nm grown in the direction of a normal line with respect to a surface of the substrate. Further, a microcrystalline semiconductor and a non-single crystal semiconductor are mixed. A peak of the Raman spectrum of the microcrystalline silicon which is a typical example of a microcrystalline semiconductor is shifted toward lower wavenumber than 520 cm$^{-1}$ which represents the peak of the Raman spectrum of single crystal silicon. That is, a peak of the Raman spectrum of microcrystalline silicon lies between 520 cm$^{-1}$ which represents that of single-crystal silicon, and 480 cm$^{-1}$ which represents that of amorphous silicon. The semiconductor includes at least 1 atomic % of hydrogen or halogen to terminate a dangling bond. Further, a rare gas element such as helium, argon, krypton, or neon may be contained to further promote lattice distortion, so that stability is enhanced and a favorable microcrystalline semiconductor film can be obtained. Such description about a microcrystalline semiconductor film is disclosed in, for example, U.S. Pat. No. 4,409,134.

The microcrystalline semiconductor film can be formed by a high-frequency plasma CVD apparatus with a frequency of several tens of MHz to several hundred MHz or a microwave plasma CVD apparatus with a frequency of 1 GHz or more. The microcrystalline semiconductor film can be typically formed by diluting silicon hydride or silicon halide, such as $SiH_4$, $Si_2H_6$, $SiH_2Cl_2$, $SiHCl_3$, $SiCl_4$, or $SiF_4$, with hydrogen. In addition, the microcrystalline semiconductor film may be formed by dilution with one or a plurality of kinds of rare gas elements selected from helium, argon, krypton, and neon in addition to the above gases. The flow rate of hydrogen is 5 times or more and 200 times or less, preferably 50 times or more and 150 times or less, more preferably 100 times as much as that of silicon hydride or silicon halide.

Further, by adding germane ($GeH_4$) or the like to the plasma CVD deposition gas, the structure in which part of silicon is substituted with germanium is formed while the crystal structure specific to silicon is held. Accordingly, the lattice constant of a crystal to be formed can be small. Therefore, the value of the lattice constant of the formed crystal structure specific to silicon can approximate that of the YSZ film, so that crystallization of the microcrystalline semiconductor film can be promoted.

Further, the microcrystalline semiconductor film shows low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after deposition of the microcrystalline semiconductor film, so that the threshold may be controlled. A typical example of the impurity element imparting p-type conductivity is boron, and an impurity gas such as $B_2H_6$ or $BF_3$ is preferably added to silicon hydride at a proportion of from 1 to 1000 ppm, more preferably 1 to 100 ppm. The concentration of boron is preferably set at, for example, $1\times10^{14}$ to $6\times10^{16}$ atoms/cm$^3$.

Further, the microcrystalline semiconductor film preferably contains oxygen at a concentration of $5\times10^{19}$ atoms/cm$^3$ or less, more preferably $1\times10^{19}$ atoms/cm$^3$ or less, and nitrogen and carbon each at a concentration of $1\times10^{18}$ atoms/cm$^3$ or less. By reducing concentrations of oxygen, nitrogen, and carbon which are to be mixed into the microcrystalline semiconductor film, the microcrystalline semiconductor film can be prevented from being made to have n-type conductivity.

The microcrystalline semiconductor film 53 is formed to a thickness of larger than 0 nm and smaller than or equal to 50 nm, preferably larger than 0 nm and smaller than or equal to 20 nm.

Figure 6A:
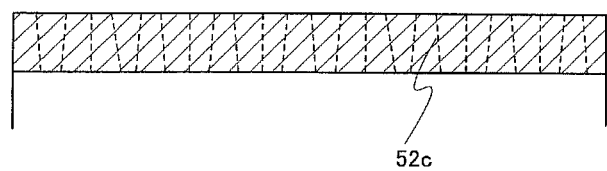
FIGS. 6A and 6B are cross-sectional views illustrating a manufacturing method of the present invention.
Figure 6B:
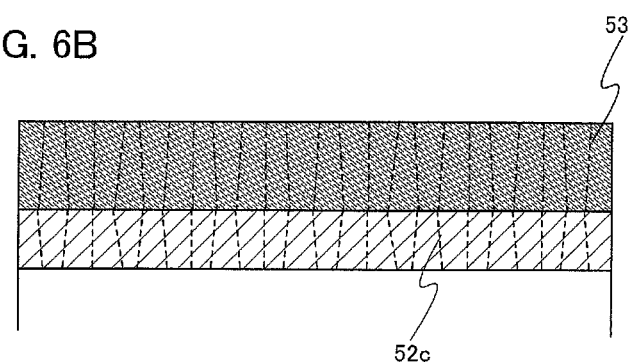

At that time, the microcrystalline semiconductor film 53 which is formed over the gate insulating film 52c which is formed of a YSZ film with an excellent crystallinity as illustrated in FIG. 6A is affected by the crystal structure of the YSZ film, around an interface with the YSZ film which is the gate insulating film; therefore, crystallinity is improved as illustrated in FIG. 6B.

The microcrystalline semiconductor film 53 functions as a channel formation region of a thin film transistor to be formed later. When the microcrystalline semiconductor film 53 is formed to a thickness within the above range, a thin film transistor to be formed later is to be a completely-depleted type. Further, since the microcrystalline semiconductor film contains microcrystals, it has lower resistance than an amorphous semiconductor film. Therefore, a thin film transistor using the microcrystalline semiconductor film has current-voltage characteristics represented by a curve with a steep slope in a rising portion, has excellent responsiveness as a switching element, and can be operated at high speed. Further, by using the microcrystalline semiconductor film for the channel formation region of the thin film transistor, fluctuation in threshold of the thin film transistor can be suppressed. Therefore, a liquid crystal display device with less variation in electrical characteristics can be manufactured.

The microcrystalline semiconductor film has higher mobility than an amorphous semiconductor film. Thus, by using for a switching element of a display device a thin film transistor in which a channel formation region is formed of the microcrystalline semiconductor film, the area of the thin film transistor can be reduced. Accordingly, the area of the thin film transistor in one pixel is reduced and thus, the aperture ratio of the pixel can be increased. Accordingly, the display device can have high definition.

The buffer layer 54 is formed after the microcrystalline semiconductor film 53 is formed. The buffer layer 54 is formed using an amorphous semiconductor film containing hydrogen, nitrogen, or halogen. An amorphous semiconductor film containing hydrogen can be formed using hydrogen with a flow rate of 1 to 10 times, preferably 1 to 5 times as high as that of silicon hydride. Further, an amorphous semiconductor film containing nitrogen can be formed using the silicon hydride and nitrogen or ammonia. Further, an amorphous semiconductor film containing fluorine or chlorine can be formed using the silicon hydride, and a gas containing fluorine or chlorine ($F_2$, $Cl_2$, HF, HCl, or the like). Note that instead of silicon hydride, $SiH_2Cl_2$, $SiHCl_3$, $SiCl_4$, $SiF_4$, or the like can be used.

Further, the buffer layer 54 can be formed by sputtering with hydrogen or a rare gas using an amorphous semiconductor as a target. At that time, ammonia, nitrogen, or $N_2O$ is contained in the atmosphere, so that an amorphous semiconductor film containing nitrogen can be formed. Further, a gas containing fluorine or chlorine ($F_2$, $Cl_2$, HF, HCl or the like) is contained in the atmosphere, so that an amorphous semiconductor film containing fluorine or chlorine can be formed.

The buffer layer 54 is preferably formed using an amorphous semiconductor film which does not contain crystal grains. Therefore, in the case where the buffer layer 54 is formed by a high-frequency plasma CVD apparatus or a microwave plasma CVD apparatus with a frequency of several tens of MHz to several hundred MHz, formation conditions are preferably controlled such that an amorphous semiconductor film does not contain crystal grains.

In a later process for forming a source region and a drain region, the buffer layer 54 is partially etched. At that time, it is preferable to form the buffer layer 54 to a sufficient thickness so that part thereof is left so as not to expose the microcrystalline semiconductor film 53. Typically, the buffer layer 54 is formed to a thickness of larger than or equal to 50 nm and smaller than or equal to 400 nm, preferably larger than or equal to 80 nm and smaller than or equal to 300 nm. In a display device including a thin film transistor to which high voltage (for example, approximately 15 V) is applied, typically, in a liquid crystal display device, when the buffer layer 54 is formed to a large thickness as described above, a withstand voltage is increased, so that deterioration of the thin film transistor can be prevented even if a high voltage is applied to the thin film transistor.

Note that an impurity element imparting one conductivity type, such as phosphorus or boron, is not added to the buffer layer 54. The buffer layer 54 functions as a barrier layer so that an impurity element from a semiconductor film 55 to which an impurity element imparting one conductivity type is added, which is to be formed later, is not dispersed into the microcrystalline semiconductor film 53. Although the buffer layer 54 is not necessarily provided, when the microcrystalline semiconductor film 53 and the semiconductor film 55 to which an impurity element imparting one conductivity type is added come into contact with each other, the impurity element moves in a later etching step or heat treatment, and thus there is a possibility that control of a threshold becomes difficult.

Further, by forming the buffer layer 54 over a surface of the microcrystalline semiconductor film 53, natural oxidation of surfaces of crystal grains contained in the microcrystalline semiconductor film 53 can be prevented. In particular, in a region where an amorphous semiconductor is in contact with microcrystal grains, a crack is likely to be caused due to local stress. When this crack is exposed to oxygen, the crystal grains are oxidized and silicon oxide is formed.

The energy gap of the buffer layer 54 that is an amorphous semiconductor film is larger than that of the microcrystalline semiconductor film 53 (the energy gap of the amorphous semiconductor film is 1.6 to 1.8 eV and the energy gap of the microcrystalline semiconductor film 53 is 1.1 to 1.5 eV). Further, mobility of the buffer layer 54 is approximately 1/5 to 1/10 as low as that of the microcrystalline semiconductor film 53 and thus resistance is higher in the buffer layer 54 than in the microcrystalline semiconductor film 53. Therefore, in a thin film transistor to be formed later, the buffer layer formed between a source and drain regions and the microcrystalline semiconductor film 53 functions as a highly resistant region, and the microcrystalline semiconductor film 53 functions as a channel formation region. An off current of the thin film transistor can be reduced due to the high resistance as one of factors. Thus, in the case of using the thin film transistor for a switching element of a display device, contrast of the display device can be improved.

Note that the buffer layer 54 is preferably formed over the microcrystalline semiconductor film 53 at a temperature of 300 to 400° C. by a plasma CVD method. By this deposition treatment, hydrogen is supplied to the microcrystalline semiconductor film 53, and the same effect as hydrogenizing the microcrystalline semiconductor film 53 can be obtained. Specifically, by depositing the buffer layer 54 on the microcrystalline semiconductor film 53, hydrogen can be dispersed in the microcrystalline semiconductor film 53 to terminate dangling bonds.

After the buffer layer 54 is deposited, the substrate is carried without being exposed to the air, and the semiconductor film 55 to which an impurity element imparting one conductivity type is added is preferably formed in a reaction chamber different from the reaction chamber for forming the buffer layer 54. The cross-sectional view of this stage corresponds to FIG. 1C. By depositing the semiconductor film 55 to which an impurity element imparting one conductivity type is added in a reaction chamber different from the reaction chamber for forming the buffer layer 54, the impurity element imparting one conductivity type can be prevented from being mixed into the buffer layer when the buffer layer is deposited.

In the case where an n-channel thin film transistor is formed, phosphorus, which is a typical impurity element, may be added to the semiconductor film 55 to which an impurity element imparting one conductivity type is added; for example, an impurity gas such as a phosphine ($PH_3$) gas may be added to silicon hydride. In the case where a p-channel thin film transistor is formed, boron may be added as a typical impurity element, and an impurity gas such as $B_2H_6$ may be added to silicon hydride. The semiconductor film 55 to which an impurity element imparting one conductivity type is added can be formed using a microcrystalline semiconductor or an amorphous semiconductor. The semiconductor film 55 to which an impurity element imparting one conductivity type is added is formed to a thickness of larger than or equal to 2 nm and smaller than or equal to 50 nm. By forming the semiconductor film to which an impurity element imparting one conductivity type is added to a small thickness, throughput can be improved.

Figure 2A:
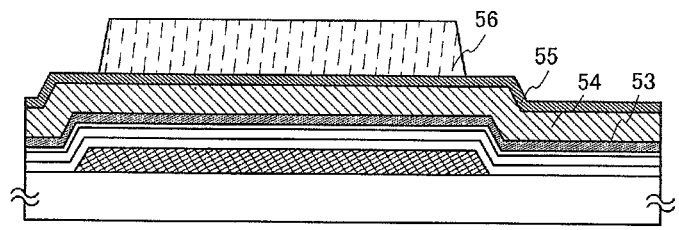
FIGS. 2A to 2D are cross-sectional views illustrating a manufacturing method of the present invention.

Then, as illustrated in FIG. 2A, a resist mask 56 is formed over the semiconductor film 55 to which an impurity element imparting one conductivity type is added. The resist mask 56 is formed by a photolithography technique or an inkjet method. Here, with a second photomask, the resist mask 56 is formed by exposing a resist applied on the semiconductor film 55 to which an impurity element imparting one conductivity type is added to light and developing the resist.

Figure 2B:
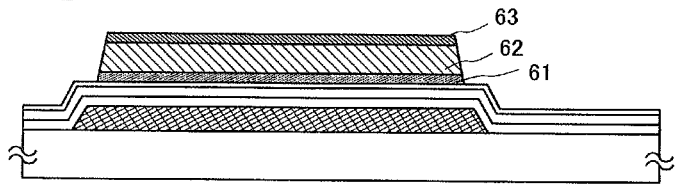

Then, the microcrystalline semiconductor film 53, the buffer layer 54, and the semiconductor film 55 to which an impurity element imparting one conductivity type is added are etched using the resist mask 56 to form an island-shaped microcrystalline semiconductor film 61, an island-shaped buffer layer 62, and an island-shaped semiconductor film 63 to which an impurity element imparting one conductivity type is added, as illustrated in FIG. 2B. After that, the resist mask 56 is removed.

The side surfaces of end portions of the island-shaped microcrystalline semiconductor film 61 and the island-shaped buffer layer 62 are inclined, so that generation of a leakage current between a source and drain regions, which are formed over the island-shaped buffer layer 62, and the island-shaped microcrystalline semiconductor film 61 can be prevented. Inclination angles of the side surfaces of the end portions of the island-shaped microcrystalline semiconductor film 61 and the island-shaped buffer layer 62 are each 30 to 90°, preferably 45 to 80°. By adopting such an angle, disconnection of the source electrode or the drain electrode due to the step can be prevented.

Figure 2C:
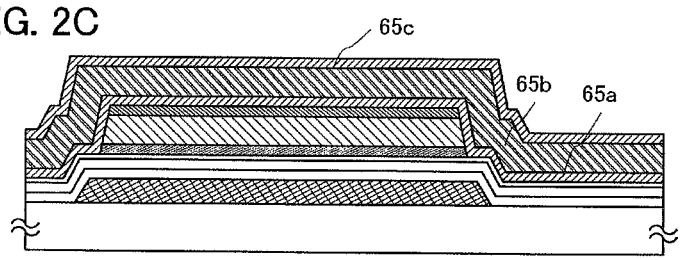

Then, as illustrated in FIG. 2C, conductive films 65a, 65b, and 65c are formed over the gate insulating film 52c and the island-shaped semiconductor film 63 to which an impurity element imparting one conductivity type is added. It is preferable that the conductive films 65a, 65b, and 65c be formed as a single layer of aluminum, copper, or an aluminum alloy to which an element which improves heat resistance or an element which prevents hillock formation, such as silicon, titanium, neodymium, scandium, or molybdenum, is added; or as a stack thereof. Alternatively, a film in contact with the semiconductor film to which an impurity element imparting one conductivity type is added may be formed using titanium, tantalum, molybdenum, tungsten, or nitride of any of these elements and aluminum or an aluminum alloy may be formed thereover to form a layered structure. Still alternatively, a top and bottom surfaces of aluminum or an aluminum alloy may be sandwiched with titanium, tantalum, molybdenum, tungsten, or nitride of any of these elements to form a layered structure. Here, as the conductive film, a conductive film with a three-layer structure in which the conductive films 65a, 65b, and 65c are stacked is described. A layered conductive film in which molybdenum films are used as the conductive films 65a and 65c and an aluminum film is used as the conductive film 65b and a layered conductive film in which titanium films are used as the conductive films 65a and 65c and an aluminum film is used as the conductive film 65b are given. The conductive films 65a, 65b, and 65c are formed by a sputtering method or a vacuum evaporation method.

Figure 2D:
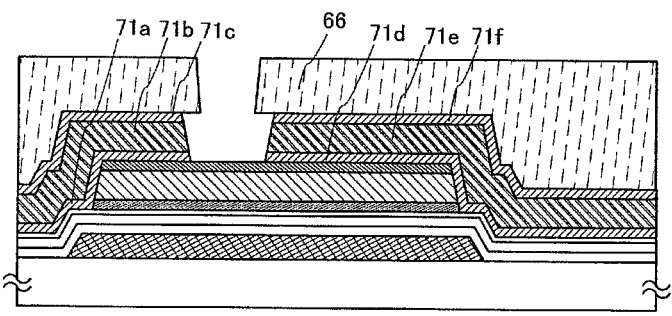

Then, as illustrated in FIG. 2D, a resist mask 66 is formed over the conductive films 65a, 65b, and 65c with the use of a third photomask, and the conductive films 65a, 65b, and 65c are partially etched to form one of a source and drain electrodes 71a, one of a source and drain electrodes 71b, one of a source and drain electrodes 71c, the other of the source and drain electrodes 71d, the other of the source and drain electrodes 71e, and the other of the source and drain electrodes 71f. In addition, by performing wet etching, each of one of the source and drain electrodes 71a, one of the source and drain electrodes 71b, one of the source and drain electrodes 71c, the other of the source and drain electrodes 71d, the other of the source and drain electrodes 71e, and the other of the source and drain electrodes 71f can be formed to have a smaller area than the resist mask 66.

Figure 3A:
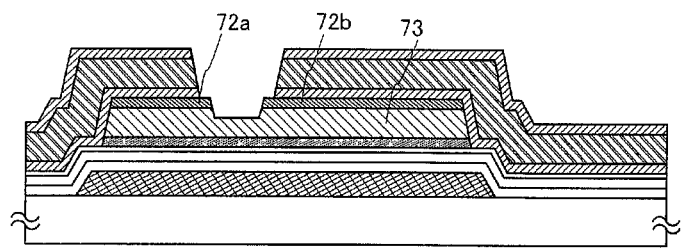
FIGS. 3A to 3C are cross-sectional views illustrating a manufacturing method of the present invention.
Figure 4:
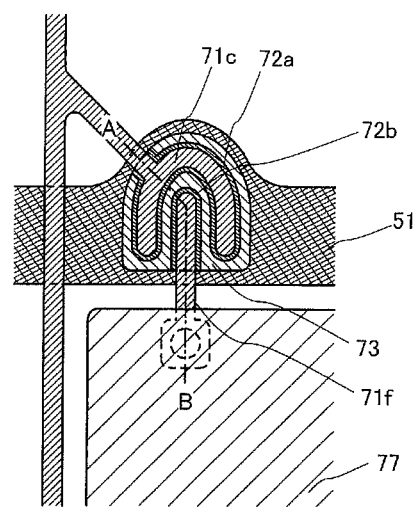
FIG. 4 is a top view illustrating a manufacturing method of the present invention.

Then, as illustrated in FIG. 3A, the semiconductor film 63 to which an impurity element imparting one conductivity type is added is etched using the resist mask 66 to form one of a source and drain regions 72a and the other of the source and drain regions 72b. In addition, in the etching step, part of the island-shaped buffer layer 62 is also etched. The buffer layer which is partially etched and has a depressed portion is referred to as a buffer layer 73. The source and drain regions and the depressed portion of the buffer layer can be formed through the same step. The depth of the depressed portion in the buffer layer is set to half to one third of the thickness of the thickest region in the buffer layer, so that the source region and the drain region can be spaced apart from each other. After that, the resist mask 66 is removed.

Figure 3B:
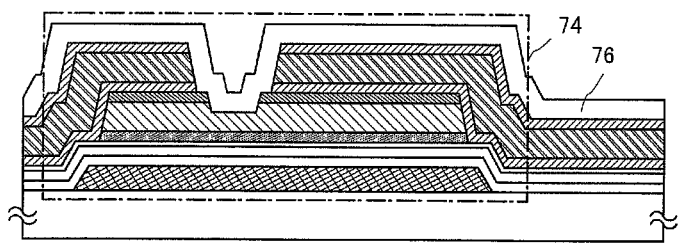
Figure 3C:
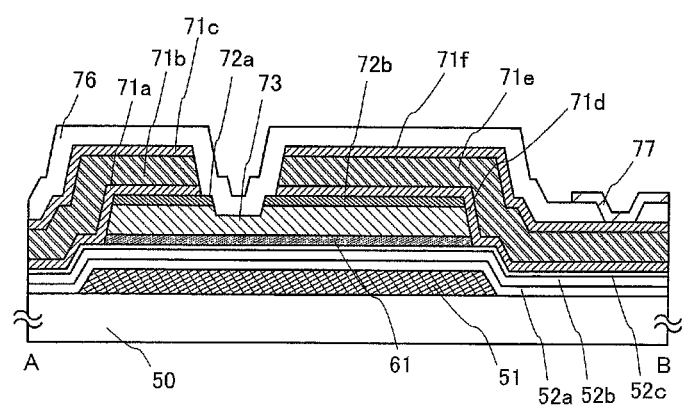

Then, as illustrated in FIG. 3B, an insulating film 76 is formed so as to cover one of the source and drain electrodes 71a, one of the source and drain electrodes 71b, one of the source and drain electrodes 71c, the other of the source and drain electrodes 71d, the other of the source and drain electrodes 71e, the other of the source and drain electrodes 71f, one of the source and drain regions 72a and the other of the source and drain regions 72b, and the buffer layer 73. The insulating film 76 can be formed using the same deposition method as the gate insulating films 52a, 52b, and 52c. Note that the insulating film 76 is for preventing entrance of a contaminating impurity such as an organic substance, a metal substance, or moisture, which is floating in the atmosphere, and is preferably a dense film. Further, by using a silicon nitride film as the insulating film 76, the oxygen concentration in the island-shaped buffer layer 62 can be set to $5\times10^{19}$ atoms/cm$^3$ or less, preferably, $1\times10^{19}$ atoms/cm$^3$ or less.

As illustrated in FIG. 3B, an edge of one of the source and drain regions 72a is not aligned with edges of one of the source and drain electrodes 71a, one of the source and drain electrodes 71b, and one of the source and drain electrodes 71c and an edge of the other of the source and drain regions 72b is not aligned with edges of the other of the source and drain electrodes 71d, the other of the source and drain electrodes 71e, the other of the source and drain electrodes 71f, so that the edges of the source electrode and the drain electrode are spaced apart from each other. Thus, a leakage current or a short circuit between the source electrode and the drain electrode can be prevented. Further, an electric field can be prevented from being concentrated on the end portions of the source and drain electrodes and the source and drain regions, and thus a leakage current between the gate electrode 51 and each of the source and drain electrodes can be prevented. Accordingly, a thin film transistor with high reliability and a high withstand voltage can be manufactured.

Through the above steps, a thin film transistor 74 can be formed.

In the thin film transistor described in this embodiment mode, the gate insulating films, the microcrystalline semiconductor film, the buffer layer, the source and drain regions, and the source and drain electrodes are stacked over the gate electrode, and the buffer layer covers a surface of the microcrystalline semiconductor film which functions as a channel formation region. Further, part of the buffer layer is provided with the depressed portion, and regions other than the depressed portion are covered with the source and drain regions. That is, the source region and the drain region are spaced apart from each other due to the depressed portion formed in the buffer layer, so that a leakage current between the source region and the drain region can be reduced. Further, by partially etching the buffer layer to form the depressed portion, an etching residue which is generated in the formation step of the source and drain regions can be removed. Therefore, a leakage current (parasitic channel) can be prevented from being generated between the source region and the drain region through the residue.

Further, the buffer layer is formed between the microcrystalline semiconductor film which functions as a channel formation region and the source and drain regions. Further, the buffer layer covers a surface of the microcrystalline semiconductor film. Since the buffer layer, which has high resistance, is formed also between the microcrystalline semiconductor film and the source and drain regions, generation of a leakage current can be reduced in a thin film transistor, and deterioration due to application of a high voltage can be suppressed. Further, the buffer layer, the microcrystalline semiconductor film, and the source and drain regions are formed in regions that overlap with the gate electrode. Thus, the structure can be regarded as a structure which is not adversely affected by the form of the end portion of the gate electrode. In the case where the gate electrode has a layered structure, when aluminum is used for a lower layer thereof, aluminum may be exposed to a side surface of the gate electrode, which may form a hillock. However, by forming the source and drain regions so that they do not overlap the end portion of the gate electrode, a short circuit in the region which overlaps the side surface of the gate electrode can be prevented. Further, since the amorphous semiconductor film whose surface is terminated with hydrogen is formed as the buffer layer on the surface of the microcrystalline semiconductor film, the microcrystalline semiconductor film can be prevented from being oxidized, and an etching residue which is generated in the formation step of the source and drain regions can be prevented from being mixed into the microcrystalline semiconductor film. Thus, the thin film transistor can have excellent electric characteristics and a high withstand voltage.

Further, a channel length of the thin film transistor can be shortened, and a planar area of the thin film transistor can be reduced.

Then, the insulating film 76 is partially etched to form a contact hole with the use of a resist mask formed using a fourth photomask over the insulating film 76, and a pixel electrode 77 in contact with the other of the source and drain electrodes 71f through the contact hole is formed.

As illustrated in FIG. 4, edges of one of the source and drain regions 72a and the other of the source and drain regions 72b are located outside edges of one of the source and drain electrodes 71c and the other of the source and drain electrodes 71f, respectively. Further, an edge of the buffer layer 73 is located outside the edges of one of the source and drain regions 72a and the other of the source and drain regions 72b. Further, one of the source and drain regions 72a partially surrounds the other of the source and drain regions 72b (specifically, a U-shape or a C-shape). Therefore, an area of a region in which carriers can move can be increased, and thus the amount of current can be increased and an area for a thin film transistor can be reduced. Further, unevenness of the gate electrode does not adversely affect the microcrystalline semiconductor film and the source and drain electrodes thereover so much because the microcrystalline semiconductor film and the source and drain electrodes overlap with each other over the gate electrode; thus, reduction in coverage and generation of leakage current can be suppressed. Note that a cross section taken along dashed-dotted line A-B in FIG. 4 corresponds to a cross-sectional view of FIG. 3C.

Further, the pixel electrode 77 can be formed of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the pixel electrode 77 can be formed using a conductive composition containing a conductive macromolecule (also referred to as a conductive polymer). The pixel electrode 77 formed of the conductive composition preferably has a sheet resistance of 10000 Ω/square or less and a transmittance higher than or equal to 70% at a wavelength of 550 nm. Further, the resistance of the conductive macromolecule contained in the conductive composition is preferably 0.1 Ω·cm or less.

As a conductive macromolecule, a so-called π-electron conjugated conductive macromolecule can be used. For example, polyaniline or a derivative thereof, polypyrrole or a derivative thereof, polythiophene or a derivative thereof, a copolymer of two or more kinds of the above, and the like are given.

Here, as the pixel electrode 77, an indium tin oxide film is formed by a sputtering method, and then a resist is applied over the indium tin oxide film. Then, the resist is exposed to light and developed using a fifth photomask to form a resist mask. Then, the indium tin oxide film is etched using the resist mask to form the pixel electrode 77.

Thus, an element substrate which includes a thin film transistor having high electric field effect mobility and using a microcrystalline semiconductor film whose crystallinity is improved with a YSZ film used for a base and which is applicable to a display device can be formed.

(Embodiment Mode 2)

Although a microcrystalline semiconductor film is formed to have a single-layer structure over a YSZ film formed as a gate insulating film in Embodiment Mode 1, any method for forming a microcrystalline semiconductor film can be used as long as a microcrystalline semiconductor film is formed using silicon having a lattice constant close to that of the YSZ. In Embodiment Mode 2, in order to improve the quality of a semiconductor region which is formed in the initial stage of deposition, a gate insulating film is formed over a gate electrode, a microcrystalline semiconductor film around an interface with the gate insulating film is formed under a first deposition condition in which a deposition rate is low but a high-quality film can be formed, and then, a microcrystalline semiconductor film is deposited under a second deposition condition in which a deposition rate is high. A deposition rate may be increased either stepwise or gradually. The manner in which the deposition rate is increased will be described below.

In order to reduce a residual gas of oxygen, nitrogen, $H_2O$, or the like inside a vacuum chamber (reaction chamber) as much as possible in advance before deposition, the first deposition condition in which a deposition rate is low but a high-quality film can be formed is as follows. The ultimate minimum pressure is reduced to an ultra-high vacuum (UHV) region of $1 \times 10^{-10}$ to $1 \times 10^{-7}$ Torr (approximately $1 \times 10^{-8}$ to $1 \times 10^{-5}$ Pa), a source gas with high purity is introduced, and a substrate temperature in deposition is within a range of 100 to 300° C.

Further, it is acceptable as long as a deposition rate under the second deposition condition is at least higher than that under the first deposition condition. For example, a flow ratio of a silane gas to a hydrogen gas is changed from that under the first deposition condition and the concentration of hydrogen may be reduced within a range that allows formation of the microcrystalline semiconductor film. Alternatively, the deposition rate under the second deposition condition may be increased by setting a substrate temperature higher than that under the first deposition condition, for example, 300° C. or higher. Alternatively, the deposition rate under the second deposition condition may be increased by increasing power as compared to that under the first deposition condition. Alternatively, the deposition rate under the second deposition condition may be increased by adjusting an evacuation valve such as a conductance valve of the reaction chamber so that the degree of vacuum under the second deposition condition is different from that under the first deposition condition.

Further, even in the case where a deposition condition is changed from the first deposition condition in the initial stage of deposition to the second deposition condition in the later stage of deposition with a high deposition rate, a microcrystal is formed in the initial stage of deposition; therefore, a high quality microcrystalline semiconductor film can be deposited with the microcrystal obtained in the initial stage as a nucleus. Further, by forming the microcrystal in advance in the initial stage of deposition, a deposition rate in the later stage of deposition can be increased.

Figure 7A:
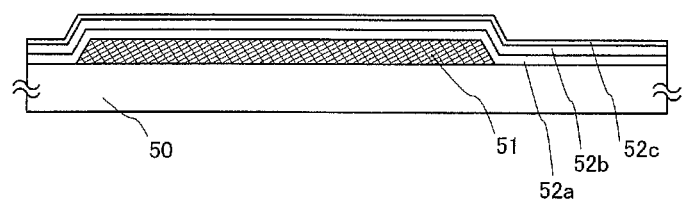
FIGS. 7A to 7D are cross-sectional views illustrating a manufacturing method of the present invention.

FIG. 7A illustrates a cross-sectional view of a structure in which films up to gate insulating films with a YSZ film in the uppermost layer are formed as described in Embodiment Mode 1. After that, a deposition process for forming a microcrystalline semiconductor film is performed in the manner described above. In this embodiment mode, a microcrystalline semiconductor film around an interface with the gate insulating film is formed under the first deposition condition that is low in deposition rate but results in a high-quality film, and then a microcrystalline semiconductor film is deposited under the second deposition condition that is high in deposition rate is high.

There is no particular limitation on the deposition conditions as long as the deposition rate under the second deposition condition is higher than that under the first deposition condition. Therefore, a microcrystalline semiconductor film can be formed by a high frequency plasma CVD apparatus with a frequency of several tens of MHz to several hundred MHz or a microwave plasma CVD apparatus with a frequency of 1 GHz or more. The microcrystalline semiconductor film can be typically formed by generating plasma by diluting a silicon hydride such as silane ($SiH_4$), disilane ($Si_2H_6$), or the like with hydrogen. In addition, the microcrystalline semiconductor film may be formed by dilution with one or plural kinds of rare gas elements selected from helium, argon, krypton, and neon in addition to silicon hydride and hydrogen. Note that instead of silicon hydride, $SiH_2Cl_2$, $SiHCl_3$, $SiCl_4$, $SiF_4$, or the like may be used.

Further, in the case of adding helium to a source gas, since helium has an ionization energy of 24.5 eV that is the highest among all gases, and has a metastable state in the level of approximately 20 eV that is a little lower than the ionization energy, only the difference of approximately 4 eV is required for ionization while discharge is kept. Therefore, a discharge starting voltage of helium has the lowest value in all gases. Owing to such characteristics, plasma can be held stably with helium. Further, uniform plasma can be formed, so that there is an effect that plasma density is uniform even when the area of the substrate on which a microcrystalline semiconductor film is deposited is increased.

Further, an energy band width may be adjusted to 1.5 to 2.4 eV or 0.9 to 1.1 eV by mixing hydride of carbon such as $CH_4$ or $C_2H_6$, germanium hydride such as $GeH_4$ or $GeF_4$, or germanium fluoride into a gas such as silane. When carbon or germanium is added to silicon, temperature characteristics of a thin film transistor can be changed.

Here, as the first deposition condition, silane is diluted 100 times or more and 2000 times or less with hydrogen, a rare gas, or hydrogen and a rare gas and a heating temperature of the substrate is 100 to 300° C., preferably 120 to 220° C. It is preferable that deposition be performed at a temperature of 120 to 220° C. so that a growing surface of the microcrystalline semiconductor film is inactivated with hydrogen and growth of microcrystalline silicon from a crystal nucleus in the film is promoted.

Figure 7B:
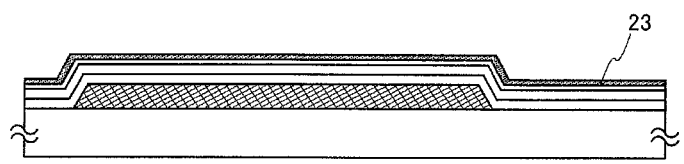

FIG. 7B illustrates a cross-sectional view of the stage in which the first deposition condition has been completed. A microcrystalline semiconductor film 23 which is formed with a low deposition rate but has high quality is formed over the gate insulating film 52c. The microcrystalline semiconductor film 23 is affected by crystallinity of the YSZ film which is a base and thus the crystallinity of the microcrystalline semiconductor film 23 is high as compared to the condition in which the base is an amorphous film. The quality of the microcrystalline semiconductor film 23 obtained under the first deposition condition contributes to increase in on current and improvement in field effect mobility of a thin film transistor that is formed later; therefore, it is important to sufficiently reduce an oxygen concentration in the film to $1 \times 10^{17}$ atoms/$cm^3$ or less. Further, by the above procedure, not only the concentration of oxygen mixed into the microcrystalline semiconductor film is reduced, but those of nitrogen and carbon can also be reduced; therefore, the microcrystalline semiconductor film can be prevented from being made to have n-type conductivity.

Figure 7C:
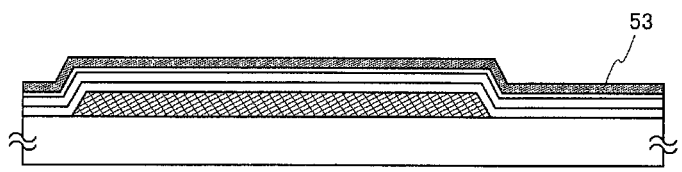

Then, a deposition condition is changed to the second deposition condition (a deposition rate is increased to that of the second deposition condition) to deposit a microcrystalline semiconductor film 53. A cross-sectional view of this stage corresponds to FIG. 7C. The thickness of the microcrystalline semiconductor film 53 may be 50 to 500 nm (preferably 100 to 250 nm). Note that in this embodiment mode, deposition time of the microcrystalline semiconductor film 53 includes a first deposition period in which deposition is performed under the first deposition condition, and a second deposition period in which deposition is performed under the second deposition condition.

Here, as the second deposition condition, silane is diluted 12 times or more and 100 times or less with hydrogen, a rare gas, or hydrogen and a rare gas, and a heating temperature of the substrate is 100 to 300° C., preferably 120 to 220° C. A deposition rate is reduced, so that crystallinity tends to be improved.

In this embodiment mode, a capacitively coupled (parallel plate) plasma CVD apparatus is used, a gap (a distance between an electrode surface and a substrate surface) is set to 20 mm, and deposition is performed under the first deposition condition and the second deposition condition. Under the first deposition condition, the degree of vacuum in the reaction chamber is 100 Pa, the substrate temperature is 100° C., 30 W of high-frequency power with a frequency of 60 MHz is applied, and a silane gas (a flow rate of 2 sccm) is diluted 200 times with hydrogen (a flow rate of 400 sccm). Under the second deposition condition, the gas flow rate is changed to increase a deposition rate, and a silane gas of 4 sccm is diluted 100 times with hydrogen (a flow rate of 400 sccm).

Then, after deposition of the microcrystalline semiconductor film 53 under the second deposition condition is completed, supply of the source gas such as silane and hydrogen and the high-frequency power is stopped, and the substrate is taken out. In the case of performing the deposition treatment on a subsequent substrate, the same treatment starting from substrate installation is performed.

It is to be noted that in order to remove a coating film or powder that is attached to the inside of the reaction chamber, cleaning is performed. The cleaning is performed by plasma etching such that an etching gas typified by $NF_3$ and $SF_6$ is introduced. Alternatively, a gas which can etch without using plasma, such as $ClF_3$, is introduced to perform the cleaning. In the cleaning, it is preferable to turn off a heater for heating the substrate in order that the temperature may be low. This is for suppressing generation of a reaction by-product due to etching. After cleaning is completed, the ultimate pressure in the reaction chamber is reduced to approximately $1 \times 10^{-5}$ to $1 \times 10^{-8}$ Pa and a gas which may bring an undesirable effect is exhausted for subsequent deposition, and then the same treatment described above may be performed on a subsequent substrate by starting from precoating.

Figure 7D:
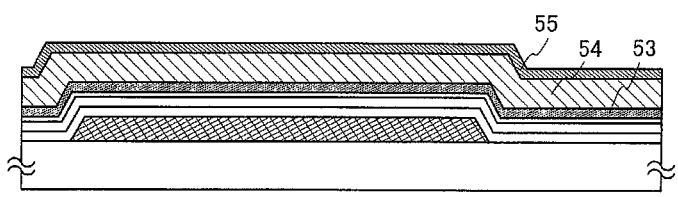

Then, after the microcrystalline semiconductor film 53 is formed, the substrate is carried without being exposed to the air, and as illustrated in FIG. 7D, a buffer layer 54 is formed in a reaction chamber different from the reaction chamber in which the microcrystalline semiconductor film 53 is formed.

Subsequent steps are performed similarly to those in Embodiment Mode 1, so that an element substrate which includes a thin film transistor using a microcrystalline semiconductor film whose crystallinity around an interface with a gate insulating film is improved with a YSZ film used for a base and which is applicable to a display device can be formed.

(Embodiment Mode 3)

In this embodiment mode, a method for forming a microcrystalline semiconductor film, which is different from that in Embodiment Mode 2, will be described. That is, a method for manufacturing a thin film transistor with excellent characteristics by a deposition method and a method for selecting a gas used for forming a microcrystalline semiconductor film by a plasma CVD method will be described.

In a method, the microcrystalline semiconductor film 23 obtained under the first deposition condition in Embodiment Mode 2 is made to have n-type conductivity, so that field effect mobility of the thin film transistor is improved. Specifically, an n-type impurity element is added in forming the microcrystalline semiconductor film under the first deposition condition. At that time, as the n-type impurity element, phosphorus, arsenic, or antimony can be used. In particular, phosphorus, which is available at low cost as a phosphine gas, is preferably used.

Further, by exposing a surface of a YSZ film in the uppermost layer of a gate insulating film to a slight amount of phosphine gas, phosphorus is made to attach to (or react with) the surface of the gate insulating film before nitrogen or oxygen is made to attach to (or react with) the surface of the gate insulating film so that much nitrogen or oxygen is prevented from being contained in the microcrystalline semiconductor film 23 around the interface with the gate insulating film.

As the atmosphere which contains a phosphine gas in a small amount, an atmosphere of a mixed gas of a phosphine gas and an inert gas (such as an argon gas), an atmosphere of a mixed gas of a silane gas and a phosphine gas, an atmosphere of a mixed gas of a silane gas diluted with hydrogen and a phosphine gas, or the like can be used. In particular, an atmosphere of a mixed gas of both a silane gas and a phosphine gas can effectively reduce nitrogen or oxygen which is to be contained in the microcrystalline semiconductor film 23 around the interface of the gate insulating film.

Further, before the microcrystalline semiconductor film 23 is formed, not only does a silane gas or a phosphine gas flow into a chamber but also plasma may be generated to form the microcrystalline semiconductor film 23 which contains phosphorus on the inner wall of the reaction chamber. By carrying the substrate to form the microcrystalline semiconductor film 23 after the microcrystalline semiconductor film 23 which contains phosphorus is formed on the inner wall of the reaction chamber, phosphorus can be contained during the initial stage of the deposition of the microcrystalline semiconductor film 23. Alternatively, by installing the substrate to form the gate insulating film and the microcrystalline semiconductor film 23 after the microcrystalline semiconductor film 23 which contains phosphorus is formed on the inner wall of the reaction chamber before the gate insulating film is formed, phosphorus may be contained during the initial stage of the deposition of the microcrystalline semiconductor film 23.

Alternatively, each flow rate is controlled, and a mixed gas in which a slight amount of phosphine gas is mixed into a silane gas diluted with hydrogen is used as a source gas to generate plasma, so that the microcrystalline semiconductor film 23 which is made to have n-type conductivity is formed and then, introduction of the small amount of phosphine gas is stopped and subsequently, a silane gas diluted with hydrogen may be used to form the microcrystalline semiconductor film 23. In the case of using this method, the concentration of phosphorus in the microcrystalline semiconductor film 23 which is made to have n-type conductivity is distributed uniformly or substantially uniformly. Alternatively, a concentration gradient may be formed in the concentration of phosphorus in the microcrystalline semiconductor film 23 which is made to have n-type conductivity by gradually changing the flow rate of the phosphine gas so that the vicinity of the gate insulating film has the concentration peak.

At that time, the phosphorus concentration in the microcrystalline semiconductor film 23 is set to be $6\times10^{15}$ atoms/cm$^3$ or more and $3\times10^{18}$ atoms/cm$^3$ or less, preferably $3\times10^{16}$ atoms/cm$^3$ or more and $3\times10^{17}$ atoms/cm$^3$ or less.

Although an example is described above in which a phosphine gas is supplied during deposition of the microcrystalline semiconductor film 23, as another method in which an n-type impurity element is added to the microcrystalline semiconductor film 23, it is also effective to supply a phosphine gas into the reaction chamber for forming the microcrystalline semiconductor film 23 only before installing the substrate.

That is, after hydrogen or a rare gas is supplied into the reaction chamber and plasma is generated to remove a gas (atmospheric components such as oxygen and nitrogen, or an etching gas used to clean the reaction chamber) attached to the inner wall of the reaction chamber, hydrogen, a silane gas, and a slight amount of phosphine gas are introduced into the reaction chamber. The silane gas can react with oxygen, moisture, and the like in the reaction chamber. With the slight amount of phosphine gas, phosphorus can be contained in the microcrystalline semiconductor film 23 to be formed later.

Subsequently, the substrate is brought into the reaction chamber and the microcrystalline semiconductor film 23 described in Embodiment Mode 1 is formed, so that phosphorus can be contained in the microcrystalline semiconductor film 23 around the interface with the gate insulating film to make the microcrystalline semiconductor film 23 have n-type conductivity. In a practical case, the phosphorus concentration in the microcrystalline semiconductor film is reduced as the distance from the interface with the gate insulating film increases.

In the above method, by using a microcrystalline semiconductor film whose crystallinity around an interface with a gate insulating film is improved with a YSZ film used for a base and which is made to have n-type conductivity, the field effect mobility of a thin film transistor can be improved.

(Embodiment Mode 4)

In this embodiment mode, a method for enhancing crystallinity of the microcrystalline semiconductor film formed according to Embodiment modes 1 to 3 will be described.

As a treatment method for enhancing crystallinity of the microcrystalline semiconductor film, a method using fluorine and a method using fluoride of hydrogen, silicon, germanium, or the like are given. Here, a surface of the microcrystalline semiconductor film is treated with glow discharge plasma with the use of a silane fluoride gas. At that time, fluorine radicals are generated from silane fluoride with the glow discharge plasma. Fluorine radicals, which are highly reactive, selectively etch an amorphous semiconductor, which is etched more easily than a microcrystalline semiconductor.

In another treatment method, a silane fluoride gas is added as the gas supplied in forming the microcrystalline semiconductor film. At that time, in forming the microcrystalline semiconductor film, the deposition proceeds while an amorphous semiconductor, which is easily etched, is etched selectively with fluorine radicals. Thus, a microcrystalline semiconductor after the deposition has high crystallinity.

These treatment methods for enhancing crystallinity are effective not only in the initial stage of forming the microcrystalline semiconductor film but also in forming the microcrystalline semiconductor film 53 by changing the first deposition condition to the second deposition condition described in Embodiment Mode 2 by increasing the deposition rate. Further, the treatment methods for enhancing crystallinity are also effective in changing a deposition condition from the first deposition condition to the second deposition condition sequentially.

Further, it is also effective to supply a silane fluoride gas into the reaction chamber before bringing the substrate into the reaction chamber to form the microcrystalline semiconductor film. At that time, before bringing the substrate into the reaction chamber, a gas containing a silane fluoride gas is introduced to generate plasma, and fluorine or a fluorine compound remains as a gas in the reaction chamber or is attached to the inner wall of the reaction chamber. Thus, the remaining fluorine or fluorine compound acts on the microcrystalline semiconductor film which is formed after the substrate is brought into the reaction chamber, so that crystallinity of the microcrystalline semiconductor film can be improved.

(Embodiment Mode 5)

A method for manufacturing a thin film transistor, which is different from that in Embodiment Mode 1, will be described with reference to FIGS. 8A to 8D, FIGS. 9A and 9B, FIGS. 10A to 10C, FIGS. 11A and 11B, and FIGS. 12A to 12C. Here, steps for manufacturing a thin film transistor with the use of a process capable of reducing the number of photomasks as compared to that in Embodiment Mode 1 will be described.

In a similar manner to that illustrated in FIG. 1A which is described in Embodiment Mode 1, a conductive film is formed over a substrate 50 having an insulating surface, a resist is applied over the conductive film, and the conductive film is partially etched using a resist mask formed by a photolithography process using a first photomask, so that a gate electrode 51 is formed. Then, gate insulating films 52a, 52b, and 52c are formed in this order over the gate electrode 51.

Then, in a similar manner to that illustrated in FIG. 1A which is described in Embodiment Mode 1, a microcrystalline semiconductor film 53 is formed. Then, similarly to FIG. 1C described in Embodiment Mode 1, a buffer layer 54 and a semiconductor film 55 to which an impurity element imparting one conductivity type is added are formed in this order over the microcrystalline semiconductor film 53.

Figure 9A:
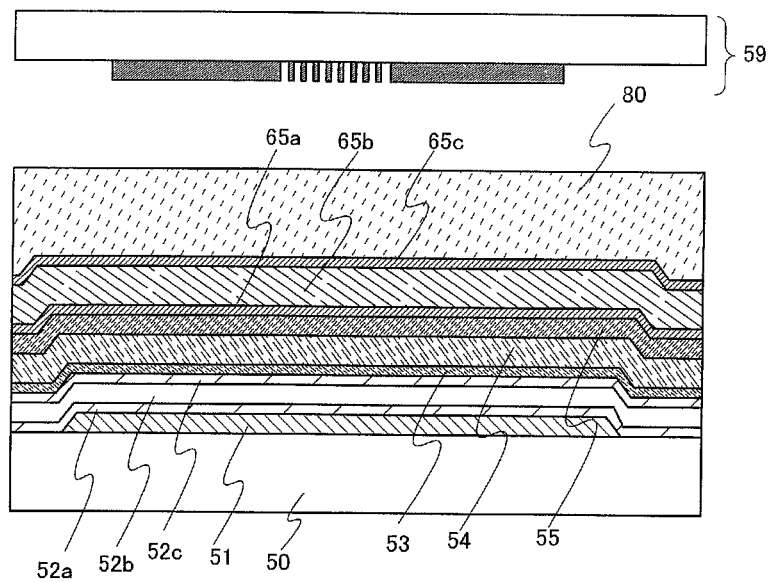
FIGS. 9A and 9B are cross-sectional views illustrating manufacturing steps of the present invention.

Then, the conductive films 65a, 65b, and 65c are formed over the semiconductor film 55 to which an impurity element imparting one conductivity type is added. Then, as illustrated in FIG. 9A, a resist 80 is applied over the conductive film 65c.

A resist 80 can be a positive resist or a negative resist. Here, a positive resist is used.

Next, the resist 80 is irradiated with light using a multi-tone mask 59 as a second photomask to be exposed to light.

Here, the exposure with the use of the multi-tone mask 59 will be described with reference to FIGS. 5A to 8D.

A multi-tone mask can achieve three levels of light exposure to obtain an exposed portion, a half-exposed portion, and an unexposed portion, and one-time exposure and development process allows a resist mask with regions of plural thicknesses (typically, two kinds of thicknesses) to be formed. The use of a multi-tone mask allows the number of photomasks to be reduced.

Figure 8A:
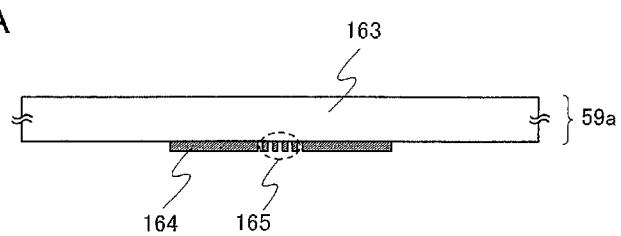
FIGS. 8A to 8D are views illustrating multi-tone masks applicable to the present invention.
Figure 8B:
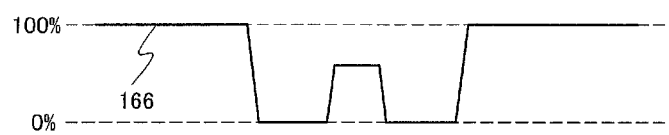
Figure 8C:
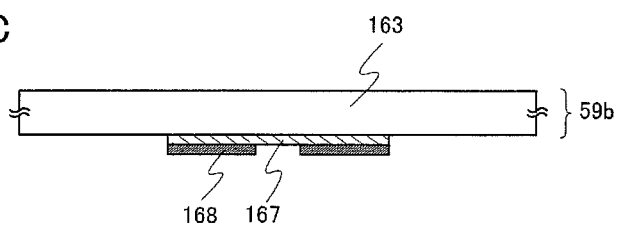

As typical examples of the multi-tone mask, a gray-tone mask 59a illustrated in FIG. 8A and a half-tone mask 59b illustrated in FIG. 8C are given.

As illustrated in FIG. 8A, the gray-tone mask 59a includes a substrate 163 having a light-transmitting property, and a light-shielding portion 164 and a diffraction grating 165 which are formed thereon. The light transmittance of the light-shielding portion 164 is 0%. On the other hand, the diffraction grating 165 has a light-transmitting portion having slits, dots, meshes, or the like at intervals less than or equal to the resolution limit of light used for the exposure; thus, the light transmittance can be controlled. Note that the diffraction grating 165 can have slits, dots, or meshes at regular intervals, or slits, dots, or meshes at irregular intervals.

As the substrate 163 having a light-transmitting property, a substrate having a light-transmitting property, such as a quartz substrate, can be used. The light-shielding portion 164 and the diffraction grating 165 can be formed using a light-shielding material which absorbs light, such as chromium or chromium oxide.

In the case where the gray-tone mask 59a is irradiated with light for exposure, light transmittance 166 of the light-shielding portion 164 is 0% and that of a region where neither the light-shielding portion 164 nor the diffraction grating 165 is provided is 100%, as illustrated in FIG. 8B. Further, the light transmittance 166 of the diffraction grating 165 can be controlled within a range of 10 to 70%. The light transmittance 166 of the diffraction grating 165 can be controlled by adjusting an interval or a pitch of slits, dots, or meshes of the diffraction grating 165.

As illustrated in FIG. 8C, the half-tone mask 59b includes the substrate 163 having a light-transmitting property, and a semi-light-transmitting portion 167 and a light-shielding portion 168 which are formed thereon. The semi-light-transmitting portion 167 can be formed using MoSiN, MoSi, MoSiO, MoSiON, CrSi, or the like. The light-shielding portion 168 can be formed using a light-shielding material which absorbs light, such as chromium or chromium oxide.

Figure 8D:
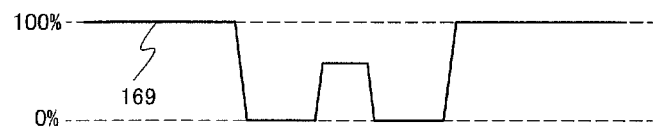

In the case where the half-tone mask 59b is irradiated with light for exposure, as illustrated in FIG. 8D, light transmittance 169 of the light-shielding portion 168 is 0% and that of a region where neither the light-shielding portion 168 nor the semi-light-transmitting portion 167 is provided is 100%. Further, the light transmittance 169 of the semi-light-transmitting portion 167 can be controlled within a range of 10 to 70%. The light transmittance 169 of the semi-light-transmitting portion 167 can be controlled depending on the material of the semi-light-transmitting portion 167.

Figure 9B:
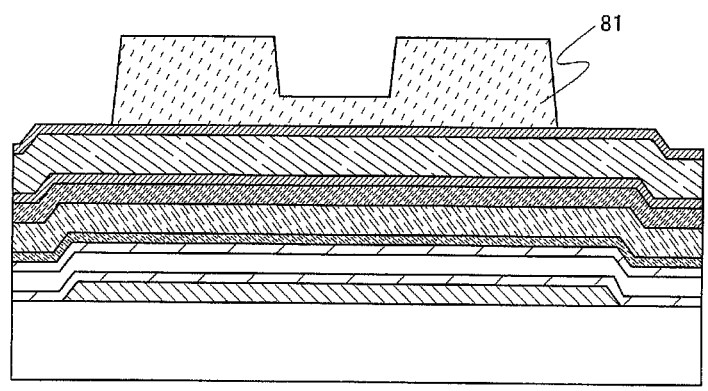

After the light exposure using the multi-tone mask, development is performed, so that a resist mask 81 with regions having different thicknesses can be formed as illustrated in FIG. 9B.

Figure 10A:
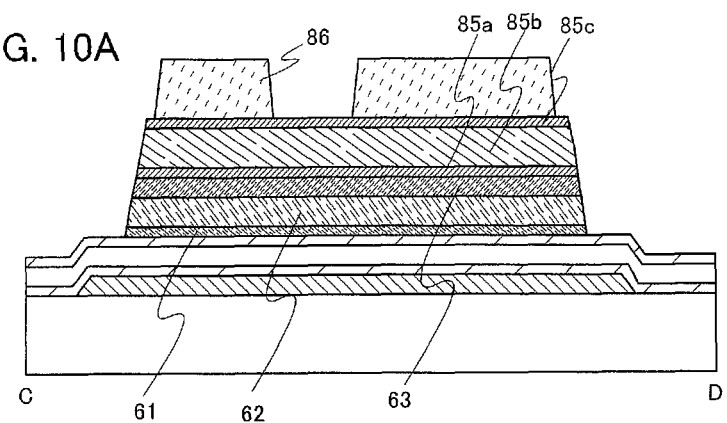
FIGS. 10A to 10C are cross-sectional views illustrating manufacturing steps of the present invention.

Then, with the resist mask 81, the microcrystalline semiconductor film 53, the buffer layer 54, the semiconductor film 55 to which an impurity element imparting one conductivity type is added, and the conductive films 65a, 65b, and 65c are etched for separation. As a result, an island-shaped microcrystalline semiconductor film 61, an island-shaped buffer layer 62, an island-shaped semiconductor film 63 to which an impurity element imparting one conductivity type is added, and island-shaped conductive films 85a, 85b, and 85c can be formed, as illustrated in FIG. 10A. Note that FIG. 10A corresponds to a cross-sectional view taken along C-D in FIG. 12A (although a resist mask 86 is not illustrated).

Then, ashing is performed on the resist mask 81. As a result, the area and the thicknesse of the resist mask are reduced. At that time, the resist mask in a region with a small thickness (a region which overlaps with part of the gate electrode 51) is removed to form the separated resist masks 86 as illustrated in FIG. 10A.

Figure 10B:
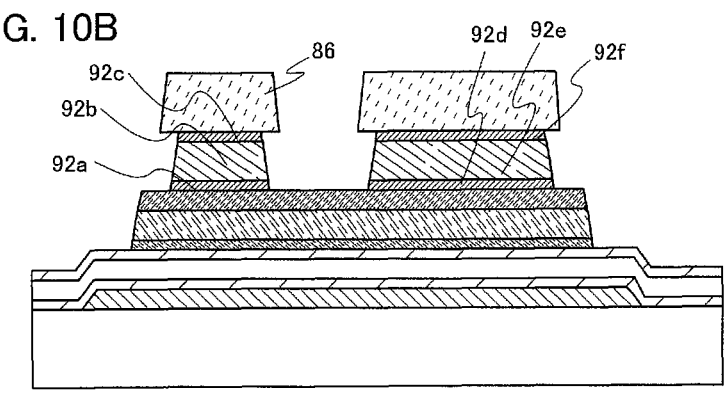

Then, the island-shaped conductive films 85a, 85b, and 85c are etched for separation with the resist mask 86. As a result, one of a source and drain electrodes 92a, one of a source and drain electrodes 92b, and one of a source and drain electrodes 92c and the other of the source and drain electrodes 92d, the other of the source and drain electrodes 92e, and the other of the source and drain electrodes 92f can be formed as illustrated in FIG. 10B. Wet etching is performed on the island-shaped conductive films 85a, 85b, and 85c with the resist mask 86 so that the source and drain electrodes having a smaller area than the resist mask 86 can be formed.

Then, the island-shaped semiconductor film 63 to which an impurity element imparting one conductivity type is added is etched using the resist mask 86, so that one of a source and drain regions 88a and the other of the source and drain regions 88b are formed. Note that in the etching step, part of the island-shaped buffer layer 62 is also etched. The partially etched buffer layer is referred to as an island-shaped buffer layer 87. Note that in the island-shaped buffer layer 87, a depressed portion is formed. The source and drain regions and the depressed portion of the buffer layer can be formed in the same step. Here, not only part of the island-shaped buffer layer 87 but the source and drain regions are etched using the resist mask 86 having a smaller area than the resist mask 81, so that edges of the island-shaped buffer layer 87 are located at outside of those of the source and drain regions. After that, the resist mask 86 is removed. Further, the edges of the source and drain electrodes are not aligned with the edges of the source and drain regions, and the end portions of the source and drain regions are formed outside the edges of the source and drain electrodes.

Figure 10C:
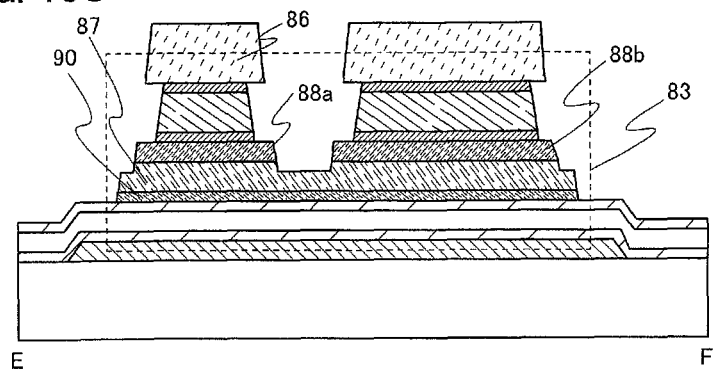

Note that FIG. 10C corresponds to a cross-sectional view taken along E-F in FIG. 12B. As illustrated in FIG. 12B, the edges of the source and drain regions are located at outside of those of the source and drain electrodes. Further, the edges of the island-shaped buffer layer 87 are located at outside of those of the source and drain regions. Further, one of the source and drain regions 88a partially surrounds the other of the source and drain regions 88b (specifically, a U-shape or a C-shape). Therefore, an area in which carriers can move can be increased, the amount of current can be increased, and an area of the thin film transistor can be reduced. Further, the microcrystalline semiconductor film and the source and drain electrodes overlap with each other over the gate electrode and are not adversely affected so much by unevenness due to the gate electrode; thus, reduction in coverage and generation of a leakage current can be suppressed.

As illustrated in FIG. 10C, the edges of the source and drain electrodes are not aligned with those of the source and drain regions and apart from each other, whereby the distance between the edges of the source and drain electrodes is increased; thus, a leakage current or a short circuit between the source and drain electrodes can be prevented. Further, the edges of the source and drain electrodes are not aligned with those of the source and drain regions and apart from each other, so that a leakage current between the gate electrode 51 and each of the source and drain electrodes can be prevented because an electric field does not concentrate at the end portions of each of the source electrode, the drain electrode, the source region, and drain region. Thus, a thin film transistor with high reliability and a high withstand voltage can be formed.

Through the above steps, a thin film transistor 83 can be formed. Further, the thin film transistor can be formed using two photomasks.

Figure 11A:
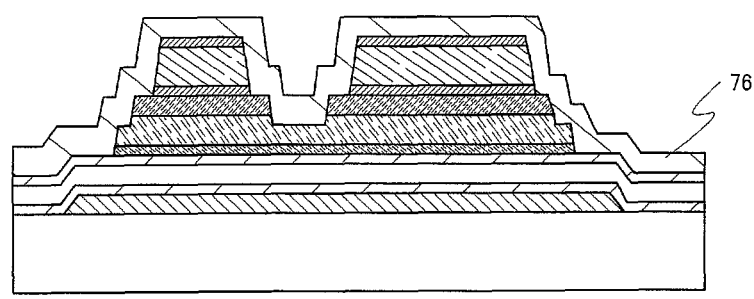
FIGS. 11A and 11B are cross-sectional views illustrating manufacturing steps of the present invention.
Figure 11B:
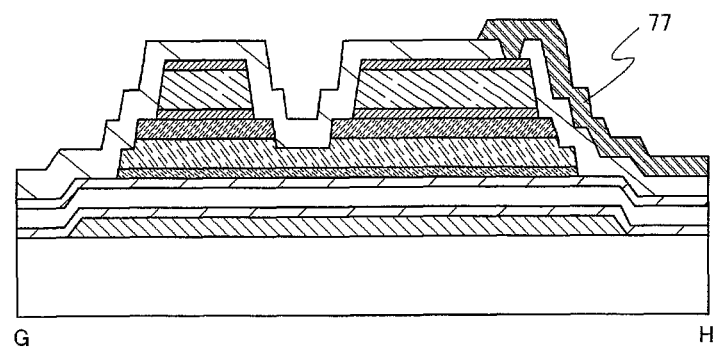

Then, as illustrated in FIG. 11A, an insulating film 76 is formed over the island-shaped source and drain electrodes, the island-shaped source and drain regions, the island-shaped buffer layer 87, the island-shaped microcrystalline semiconductor film 90, and the gate insulating film 52c. The insulating film 76 can be formed by the same manufacturing method as the gate insulating films 52a, 52b, and 52c.

Then, the insulating film 76 is partially etched using a resist mask formed using a third photomask to form a contact hole. Then, a pixel electrode 77 in contact with the other of the source and drain electrodes 92f through the contact hole is formed. Here, as the pixel electrode 77, an indium tin oxide film is formed by a sputtering method, and then a resist is applied over the indium tin oxide film. Then, the resist is exposed to light and developed using a fourth photomask, thereby forming a resist mask. Then, the pixel electrode 77 is formed by etching the indium tin oxide film by using the resist mask. Note that FIG. 11B corresponds to a cross-sectional view taken along G-H in FIG. 12C.

Thus, an element substrate which can be used for a display device can be formed using a multi-tone mask to reduce the number of masks.

Further, this embodiment mode can be freely combined with any one of Embodiment Modes 2 to 4.

(Embodiment Mode 6)

In this embodiment mode, as one mode of a display device, a liquid crystal display device including the thin film transistor described in Embodiment Mode 1 will be described below.

First, a vertical alignment (VA) liquid crystal display device will be described. The VA liquid crystal display device is a kind of mode in which alignment of liquid crystal molecules of a liquid crystal panel is controlled. The VA liquid crystal display device has a mode in which liquid crystal molecules are vertical to a panel surface when a voltage is not applied. In this embodiment mode, it is devised to particularly separate a pixel into some regions (subpixels) so that molecules are aligned in different directions in the respective regions. This is referred to as domain multiplication or multi-domain design. A liquid crystal display device with multi-domain design will be described below with reference to FIGS. 13, 14, 15, and 16.

Figure 13:
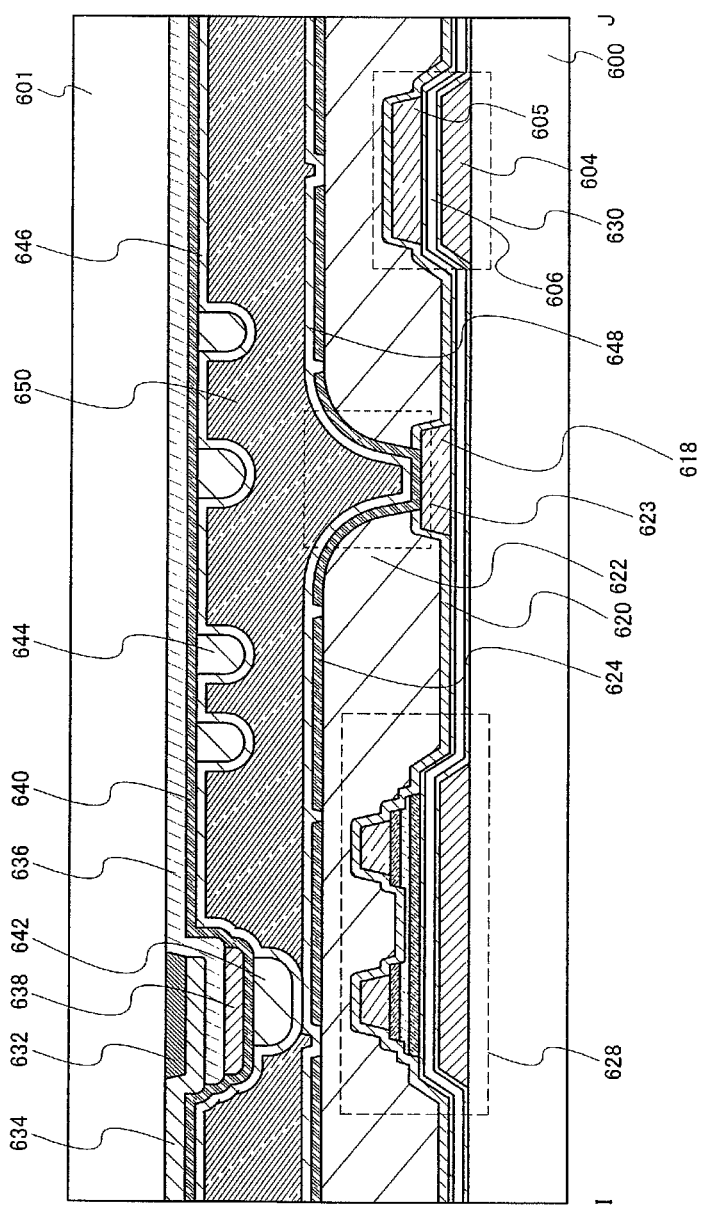
FIG. 13 is a view illustrating an example of a liquid crystal display device.
Figure 14:
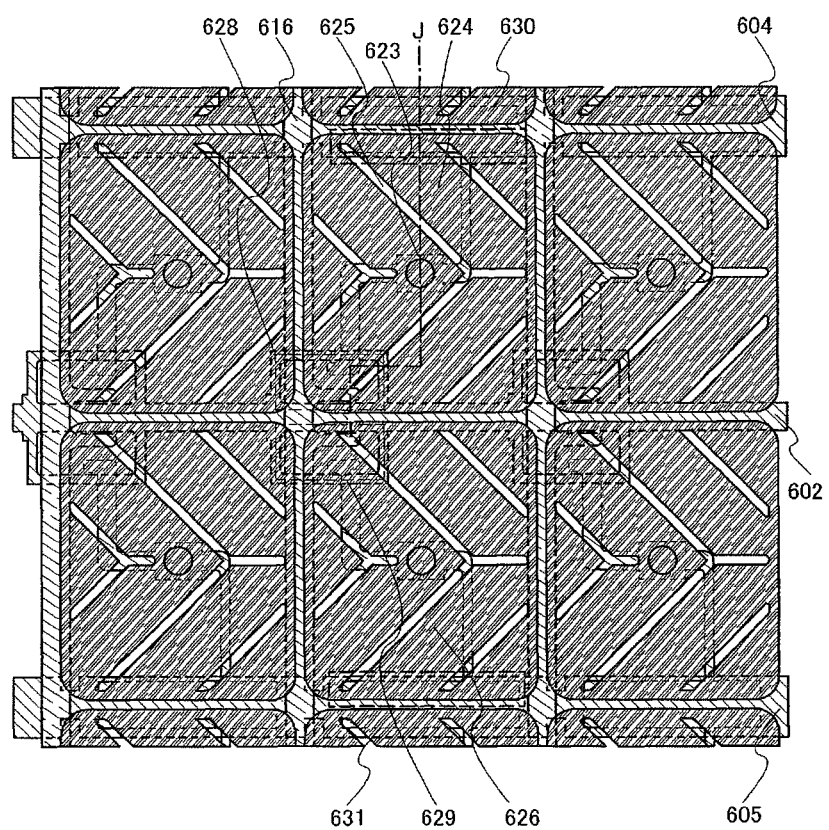
FIG. 14 is a view illustrating an example of a liquid crystal display device.
Figure 15:
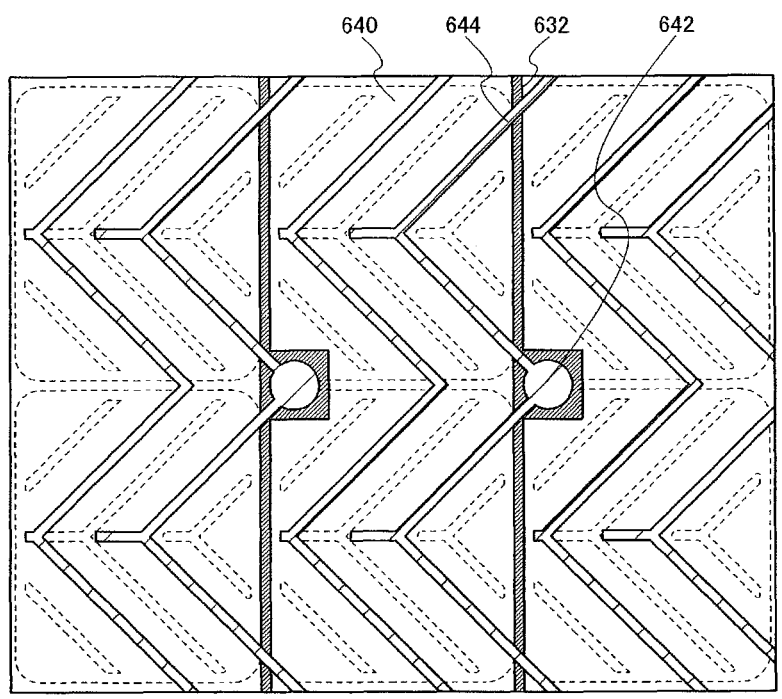
FIG. 15 is a view illustrating an example of a liquid crystal display device.

FIGS. 14 and 15 illustrate a pixel electrode and a counter electrode, respectively. Note that FIG. 14 is a plan view of the side of a substrate on which the pixel electrode is formed. FIG. 13 illustrates a cross-sectional structure along section line I-J in FIG. 14. Further, FIG. 15 is a plan view of the side of a substrate on which the counter electrode is formed. The following description will be made with reference to these drawings.

In FIG. 13, a substrate 600 provided with a thin film transistor 628, a pixel electrode 624 connected thereto, and a storage capacitor portion 630 and a counter substrate 601 provided with a counter electrode 640 and the like are overlapped with each other, and liquid crystals are injected between both the substrates.

At the position where the counter substrate 601 is provided with a spacer 642, a light-shielding film 632, a first coloring film 634, a second coloring film 636, a third coloring film 638, and the counter electrode 640 are formed. With this structure, the height of the projection 644 for controlling alignment of the liquid crystals is made different from that of the spacer 642. An alignment film 648 is formed over the pixel electrode 624, and similarly, the counter electrode 640 is provided with an alignment film 646. A liquid crystal layer 650 is formed between the alignment films 648 and 646.

Although a columnar spacer is used as the spacer 642 here, a bead spacer may be dispersed. Further, the spacer 642 may be formed over the pixel electrode 624 formed over the substrate 600.

The thin film transistor 628, the pixel electrode 624 connected thereto, and the storage capacitor portion 630 are formed over the substrate 600. The pixel electrode 624 is connected to a wiring 618 through a contact hole 623 which penetrates an insulating film 620 which covers the thin film transistor 628, the wiring 618, and the storage capacitor portion 630 and also penetrates a third insulating film 622 which covers the insulating film 620. The thin film transistor described in Embodiment Mode 1 can be used as the thin film transistor 628 as appropriate. Further, the storage capacitor portion 630 includes a first capacitor wiring 604 which is formed concurrently with a gate wiring 602 of the thin film transistor 628; a gate insulating film 606; and a second capacitor wiring 605 which is formed concurrently with a wiring 616 and the wiring 618.

The pixel electrode 624, the liquid crystal layer 650, and the counter electrode 640 are overlapped with each other, so that a liquid crystal element is formed.

FIG. 14 illustrates a structure over the substrate 600. The pixel electrode 624 is formed using the material described in Embodiment Mode 1. The pixel electrode 624 is provided with slits 625. The slits 625 are provided to control alignment of the liquid crystals.

A thin film transistor 629, a pixel electrode 626 connected thereto, and a storage capacitor portion 631 which are illustrated in FIG. 14 can be formed similarly to the thin film transistor 628, the pixel electrode 624, and the storage capacitor portion 630, respectively. Both the thin film transistors 628 and 629 are connected to the wiring 616. Each pixel of this liquid crystal panel includes the pixel electrodes 624 and 626. The pixel electrodes 624 and 626 are included in a subpixel.

FIG. 15 illustrates a structure of the counter substrate side. The counter electrode 640 is formed over the light-shielding film 632. The counter electrode 640 is preferably formed using a material similar to that of the pixel electrode 624. Projections 644 which control alignment of the liquid crystals are formed on the counter electrode 640. Further, the spacer 642 is formed corresponding to the position of the light-shielding film 632.

Figure 16:
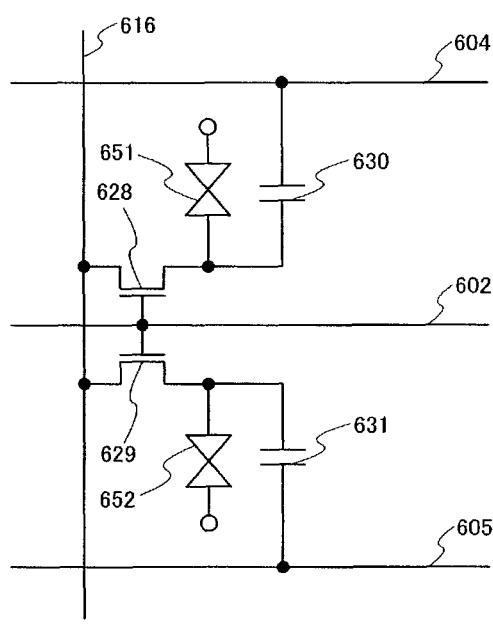
FIG. 16 is a diagram illustrating an example of a liquid crystal display device.

FIG. 16 illustrates an equivalent circuit of this pixel structure. Both the thin film transistors 628 and 629 are connected to the gate wiring 602 and the wiring 616. In that case, by making the potential of the first capacitor wiring 604 different from that of the second capacitor wiring 605, operation of a liquid crystal element 651 can be different from that of a liquid crystal element 652. Specifically, potentials of the first capacitor wiring 604 and the second capacitor wiring 605 are controlled individually, whereby alignment of the liquid crystals is precisely controlled to increase a viewing angle.

When a voltage is applied to the pixel electrode 624 provided with the slits 625, distortion of an electric field (oblique electric field) is generated in the vicinity of the slits 625. The slits 625 and the projections 644 on the counter substrate 601 side are disposed so as not to overlap with each other so that the oblique electric field is effectively generated to control alignment of the liquid crystals, whereby the direction in which the liquid crystals are aligned is different depending on the location. That is, a viewing angle of a liquid crystal panel is increased by multi-domain.

Next, another VA liquid crystal display device which is different from the above device is described with reference to FIGS. 17, 18, 19, and 20.

Figure 17:
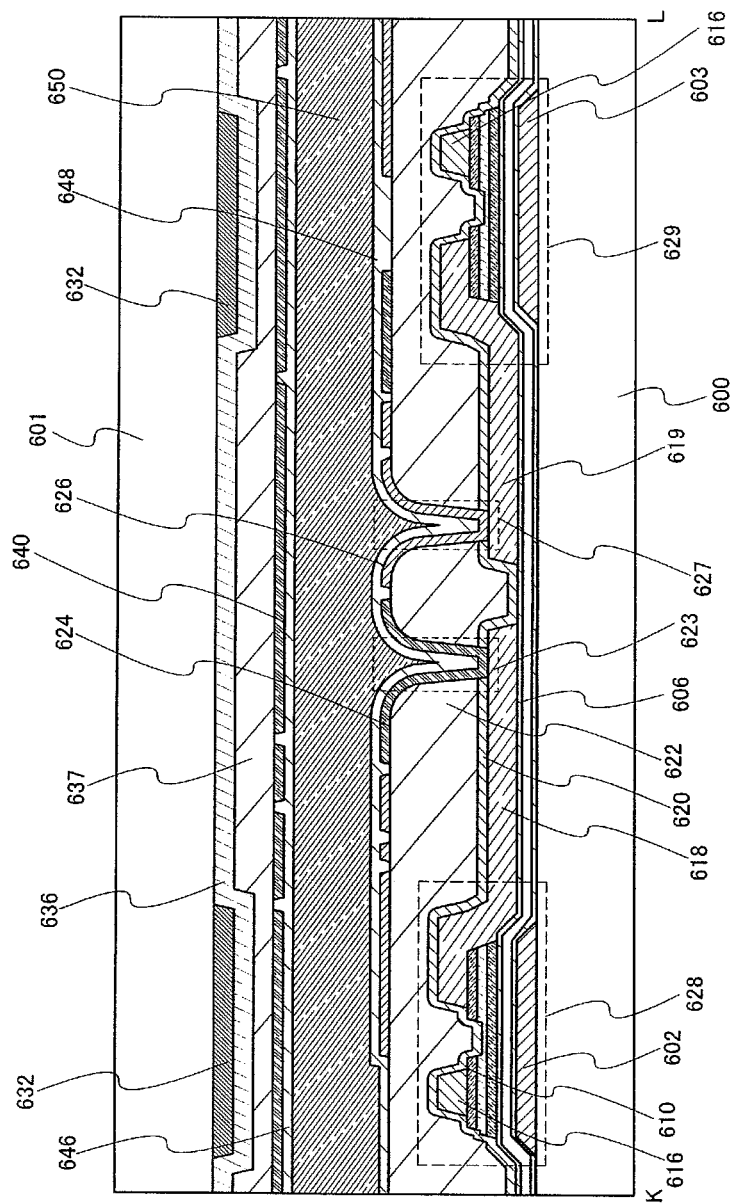
FIG. 17 is a view illustrating an example of a liquid crystal display device.
Figure 18:
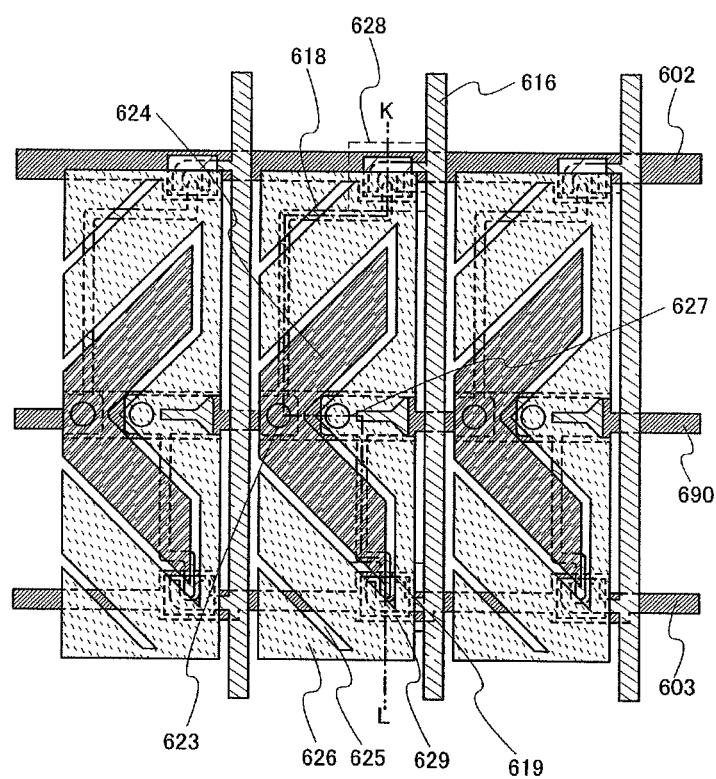
FIG. 18 is a view illustrating an example of a liquid crystal display device.

FIGS. 17 and 18 illustrate a pixel structure of a VA liquid crystal panel. FIG. 18 is a plan view of the substrate 600. FIG. 17 illustrates a cross-sectional structure taken along section line K-L in FIG. 18. The following description will be made with reference to both the drawings.

In this pixel structure, a plurality of pixel electrodes are included in one pixel, and a thin film transistor is connected to each of the pixel electrodes. Each thin film transistor is driven by a different gate signal. Specifically, a pixel of multi-domain design has a structure in which a signal applied to each pixel electrode is independently controlled.

The pixel electrode 624 is connected to the thin film transistor 628 through the wiring 618 in the contact hole 623. Further, in a contact hole 627, the pixel electrode 626 is connected to the thin film transistor 629 through a wiring 619. The gate wiring 602 of the thin film transistor 628 and a gate wiring 603 of the thin film transistor 629 are separated so as to be given different gate signals. On the other hand, the wiring 616 functioning as a data line is used in common for the thin film transistors 628 and 629. As each of the thin film transistors 628 and 629, the thin film transistor described in Embodiment Mode 1 can be used as appropriate. Further, a capacitor wiring 690 is provided.

Figure 20:
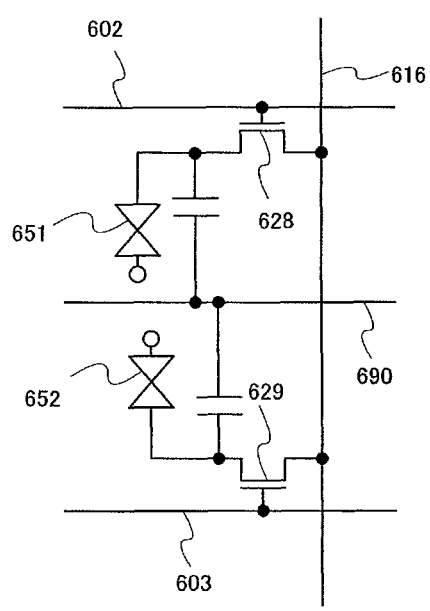
FIG. 20 is a diagram illustrating an example of a liquid crystal display device.

The pixel electrode 624 and the pixel electrode 626 have different shapes and are separated by the slits 625. The pixel electrode 626 is formed so as to surround the outside of the pixel electrode 624 which is expanded in a V shape. Timing of voltage application is made to vary between the pixel electrodes 624 and 626 by the thin film transistors 628 and 629, so that alignment of the liquid crystals is controlled. FIG. 20 illustrates an equivalent circuit of this pixel structure. The thin film transistor 628 is connected to the gate wiring 602, and the thin film transistor 629 is connected to the gate wiring 603. By giving different gate signals to the gate wirings 602 and 603, operation timings of the thin film transistors 628 and 629 can be varied.

Figure 19:
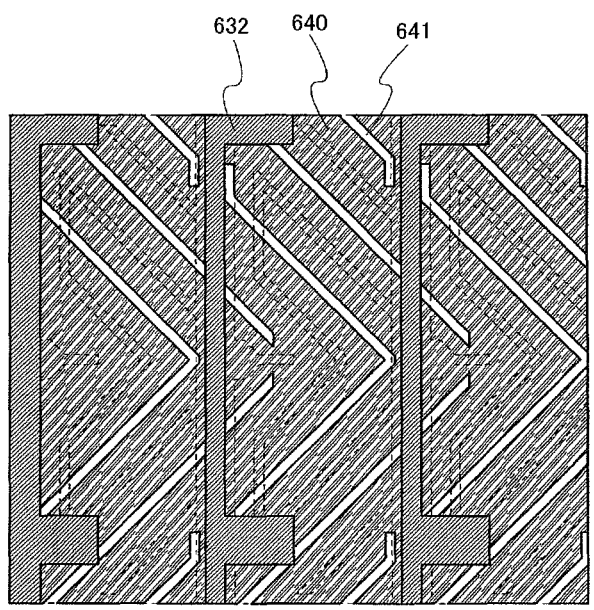
FIG. 19 is a view illustrating an example of a liquid crystal display device.

A counter substrate 601 is provided with the light-shielding film 632, a coloring film 636, and a counter electrode 640. Further, a planarization film 637 is formed between the coloring film 636 and the counter electrode 640 to prevent alignment disorder of the liquid crystals. FIG. 19 illustrates a structure of the counter substrate side. The counter electrode 640 is an electrode shared by different pixels and is provided with slits 641. The slits 641 and the slits 625 on the pixel electrodes 624 and 626 side are disposed so as not to overlap with each other so that an oblique electric field is effectively generated to control alignment of the liquid crystals. Accordingly, the direction in which the liquid crystals are aligned can be varied depending on a place, and a viewing angle is increased.

The pixel electrode 624, the liquid crystal layer 650, and the counter electrode 640 are overlapped with one another, so that a first liquid crystal element is formed. Further, the pixel electrode 626, the liquid crystal layer 650, and the counter electrode 640 are overlapped with one another, so that a second liquid crystal element is formed. Further, a multi-domain structure is adopted, in which the first liquid crystal element and the second liquid crystal element are included in one pixel.

Figure 21:
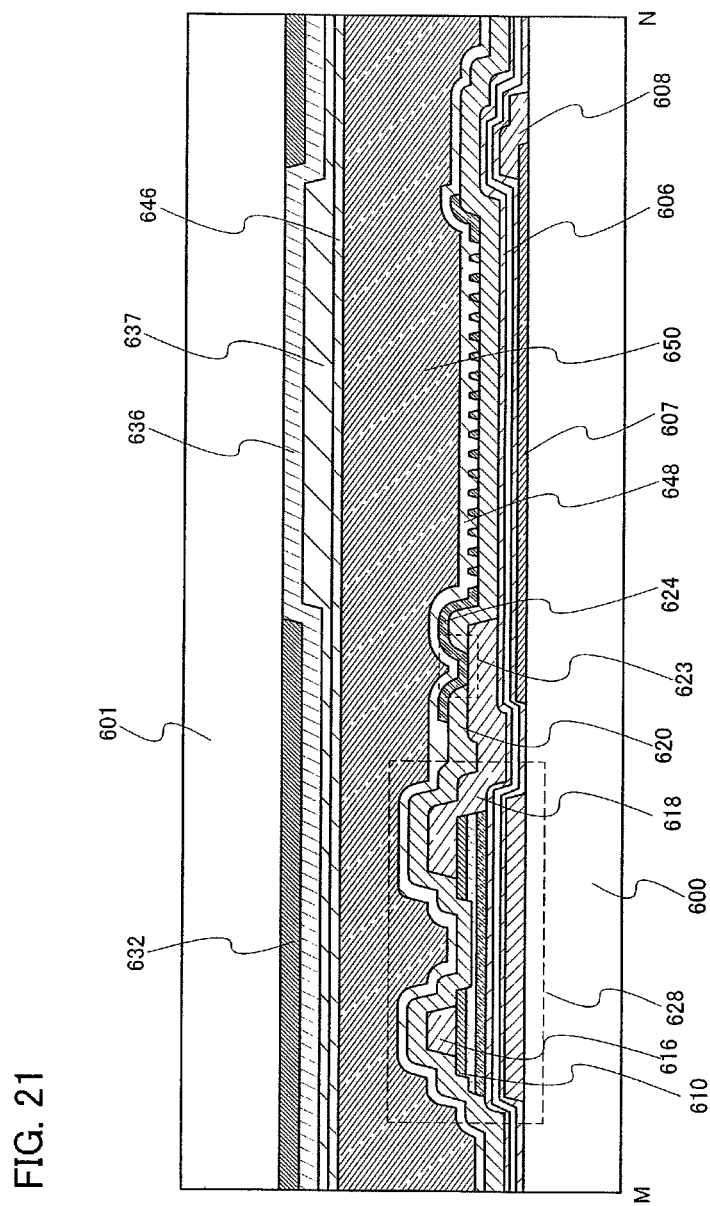
FIG. 21 is a view illustrating an example of a liquid crystal display device.
Figure 22:
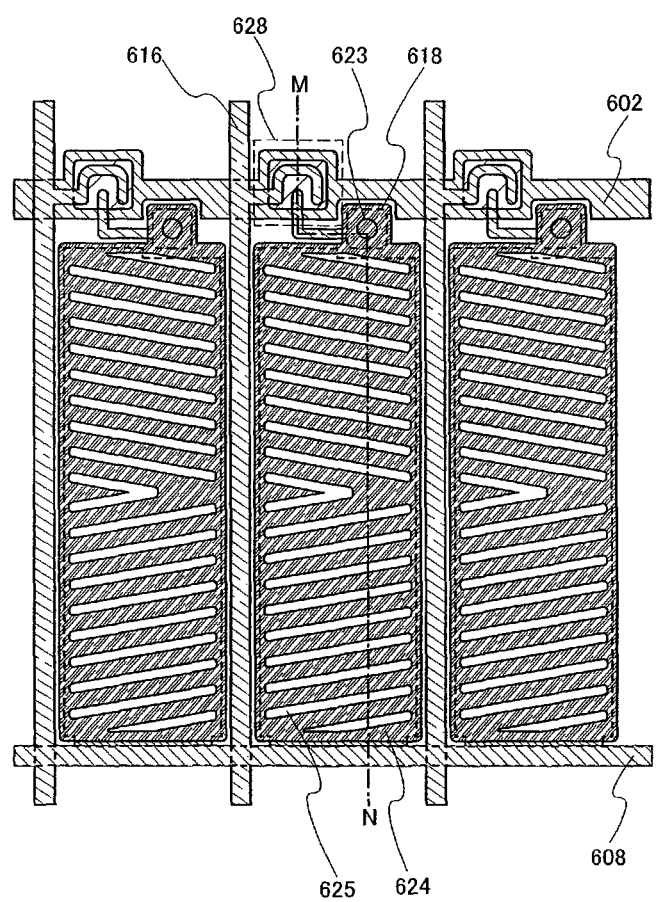
FIG. 22 is a view illustrating an example of a liquid crystal display device.

FIG. 21 and FIG. 22 illustrate a pixel structure of a transversal electric field liquid crystal display device. FIG. 22 is a plan view, and FIG. 21 illustrates a cross-sectional structure taken along section line M-N in FIG. 22. The following description will be made with reference to both drawings.

The transversal electric field mode is a mode in which an electric field is applied to liquid crystal molecules in a cell in a horizontal direction so that liquid crystals are driven to express gray scales. According to this method, a viewing angle can be increased to approximately 180°. Hereinafter, a liquid crystal display device adopting the transversal electric field mode will be described.

In FIG. 21, the substrate 600 provided with the thin film transistor 628 and the pixel electrode 624 connected thereto are formed are overlapped with the counter substrate 601, and liquid crystals are injected therebetween. The counter substrate 601 is provided with a light-shielding film 632, a coloring film 636, a planarization film 637, and the like. Being provided on the substrate 600 side, the pixel electrodes are not provided on the counter substrate 601 side. A liquid crystal layer 650 is formed between the substrate 600 and the counter substrate 601.

A first pixel electrode 607, a capacitor wiring 608 connected thereto, and the thin film transistor 628 described in Embodiment Mode 1 are formed over the substrate 600. The first pixel electrode 607 can be formed using a material similar to that of the pixel electrode 77 described in Embodiment Mode 1. Further, the first pixel electrode 607 is formed in a shape compartmentalized roughly in accordance with a pixel shape. Note that the gate insulating film 606 is formed over the first pixel electrode 607 and the capacitor wiring 608.

The wirings 616 and 618 of the thin film transistor 628 are formed over the gate insulating film 606. The wiring 616 is a data line through which a video signal travels is extended in one direction in a liquid crystal panel, is connected to one of a source and drain regions 610, and functions as one of a source and drain electrodes. The wiring 618 functions as the other of the source and drain electrodes and is connected to the second pixel electrode 624.

The second insulating film 620 is formed over the wirings 616 and 618. Further, the second pixel electrode 624 connected to the wiring 618 through a contact hole formed in the insulating film 620 is formed over the insulating film 620. The pixel electrode 624 is formed using a material similar to that of the pixel electrode 77 described in Embodiment Mode 1.

Thus, the thin film transistor 628 and the second pixel electrode 624 connected thereto are formed over the substrate 600. Note that a storage capacitor is formed between the first pixel electrode 607 and the second pixel electrode 624.

FIG. 22 is a plan view illustrating a structure of the pixel electrode. The pixel electrode 624 is provided with the slits 625. The slits 625 are provided to control alignment of liquid crystals. In that case, an electric field is generated between the first pixel electrode 607 and the second pixel electrode 624. The gate insulating film 606 is formed between the first pixel electrode 607 and the second pixel electrode 624; however, the gate insulating film 606 is formed to a thickness of 50 to 200 nm and thus is sufficiently thin as compared with a liquid crystal layer with a thickness of 2 to 10 μm. Therefore, an electric field is generated in a direction parallel to the substrate 600 (a horizontal direction). The alignment of liquid crystals is controlled by the electric field. Liquid crystal molecules are horizontally rotated utilizing an electric field in a direction substantially parallel to this substrate. In this case, since the liquid crystal molecules are horizontally aligned in any state, contrast or the like is not adversely affected so much depending on the angle of viewing; thus, the viewing angle is increased. Further, since both the first pixel electrode 607 and the second pixel electrode 624 are light-transmitting electrodes, an aperture ratio can be increased.

Next, another example of a transversal electric field liquid crystal display device will be described.

Figure 23:
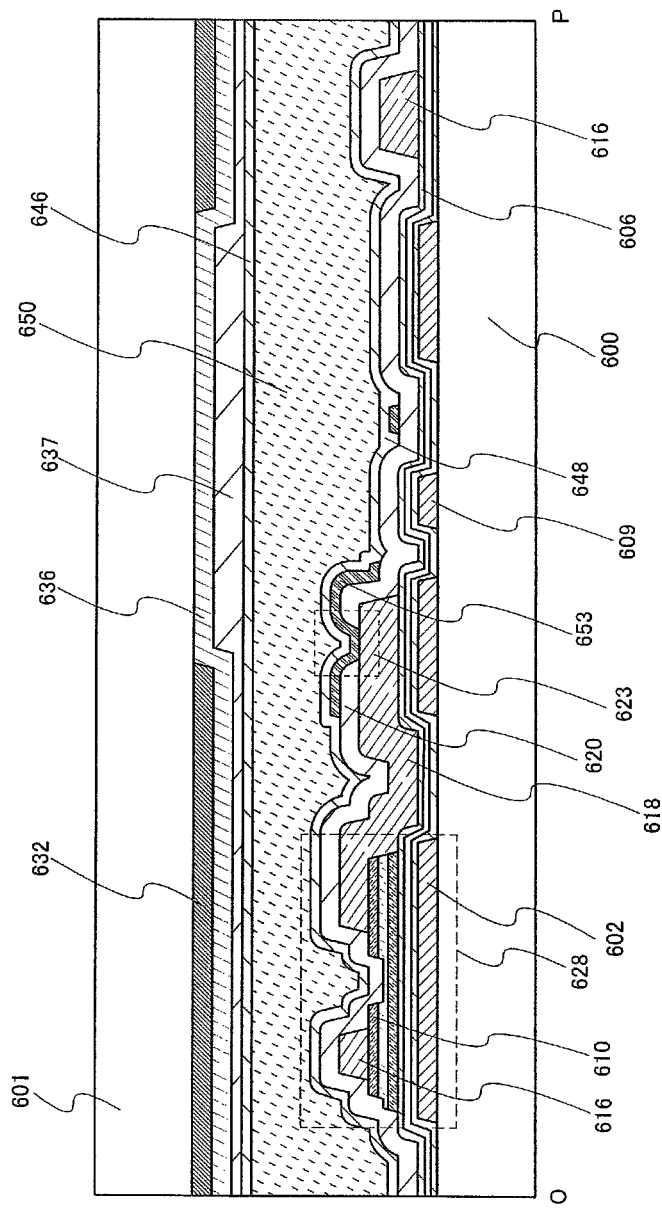
FIG. 23 is a view illustrating a liquid crystal display device of the present invention.
Figure 24:
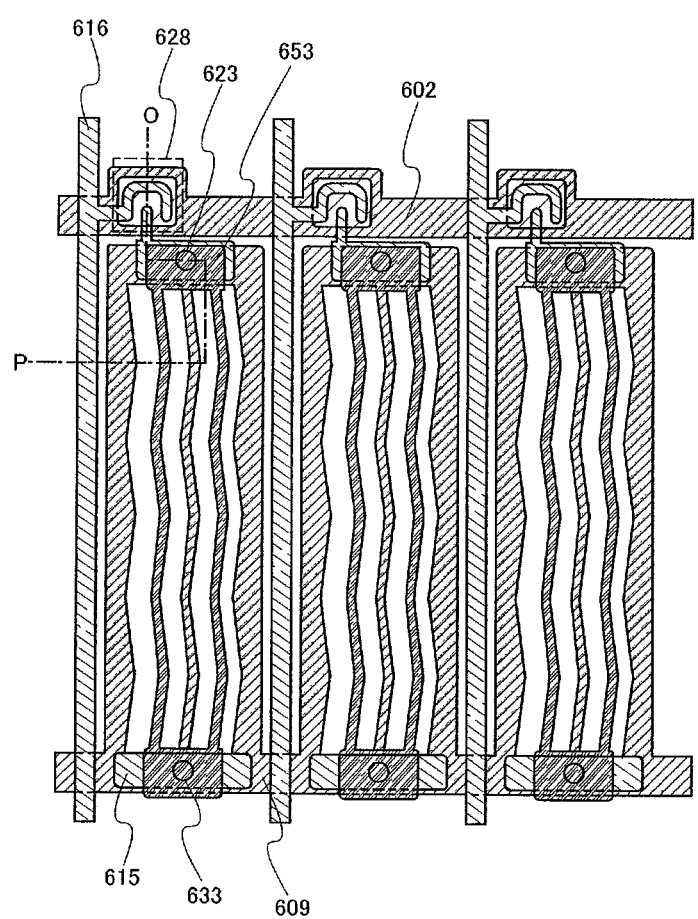
FIG. 24 is a view illustrating a liquid crystal display device of the present invention.

FIGS. 23 and 24 illustrate the pixel structure of an IPS liquid crystal display device. FIG. 24 is a plan view and FIG. 23 illustrates a cross-sectional structure along section line O-P in FIG. 24. The following description will be made with reference to both drawings.

FIG. 23 illustrates a state in which the substrate 600 provided with the thin film transistor 628 and the pixel electrode 653 connected thereto is overlapped with the counter substrate 601, and liquid crystals are injected therebetween. The counter substrate 601 is provided with the light-shielding film 632, the coloring film 636, the planarization film 637, and the like. Being provided on the substrate 600 side, the pixel electrode is not provided on the counter substrate 601 side. The liquid crystal layer 650 is formed between the substrate 600 and the counter substrate 601.

A common potential line 609 and the thin film transistor 628 described in Embodiment Mode 1 are formed over the substrate 600. The common potential line 609 can be formed concurrently with the gate wiring 602 of the thin film transistor 628. Further, the pixel electrode 653 is formed in a shape compartmentalized roughly in accordance with a pixel shape.

The wirings 616 and 618 of the thin film transistor 628 are formed over the gate insulating film 606. The wiring 616 is a data line through which a video signal travels is extended in one direction in a liquid crystal panel, is connected to one of the source and drain regions 610, and functions as one of the source and drain electrodes. The wiring 618 functions as the other of the source and drain electrodes and is connected to the pixel electrode 653.

The second insulating film 620 is formed over the wirings 616 and 618. Further, the pixel electrode 653 connected to the wiring 618 through a contact hole 623 formed in the insulating film 620 is formed over the insulating film 620. The pixel electrode 653 is formed using a material similar to that of the pixel electrode 77 described in Embodiment Mode 1. Note that as illustrated in FIG. 24, the pixel electrode 653 is formed so as to generate a transversal electric field with a comb-shaped electrode which is formed concurrently with the common potential line 609. Further, the pixel electrode 653 is formed so that comb-teeth portions of the pixel electrode 653 are not overlapped with the comb-shaped electrode which is formed concurrently with the common potential line 609.

When an electric field is generated between the potential applied to the pixel electrode 653 and the potential of the common potential line 609, the alignment of liquid crystals is controlled by this electric field. Liquid crystal molecules are horizontally rotated utilizing an electric field in a direction substantially parallel to this substrate. In this case, since the liquid crystal molecules are horizontally aligned in any state, contrast or the like is not adversely affected so much depending on the angle of viewing; thus, the viewing angle is increased.

Thus, the thin film transistor 628 and the pixel electrode 653 connected thereto are formed over the substrate 600. A storage capacitor is formed of the common potential line 609, a capacitor electrode 615, and the gate insulating film 606 provided therebetween. Further, the capacitor electrode 615 and the pixel electrode 653 are connected to each other through the contact hole 633.

Next, a mode of a TN liquid crystal display device is described.

Figure 25:
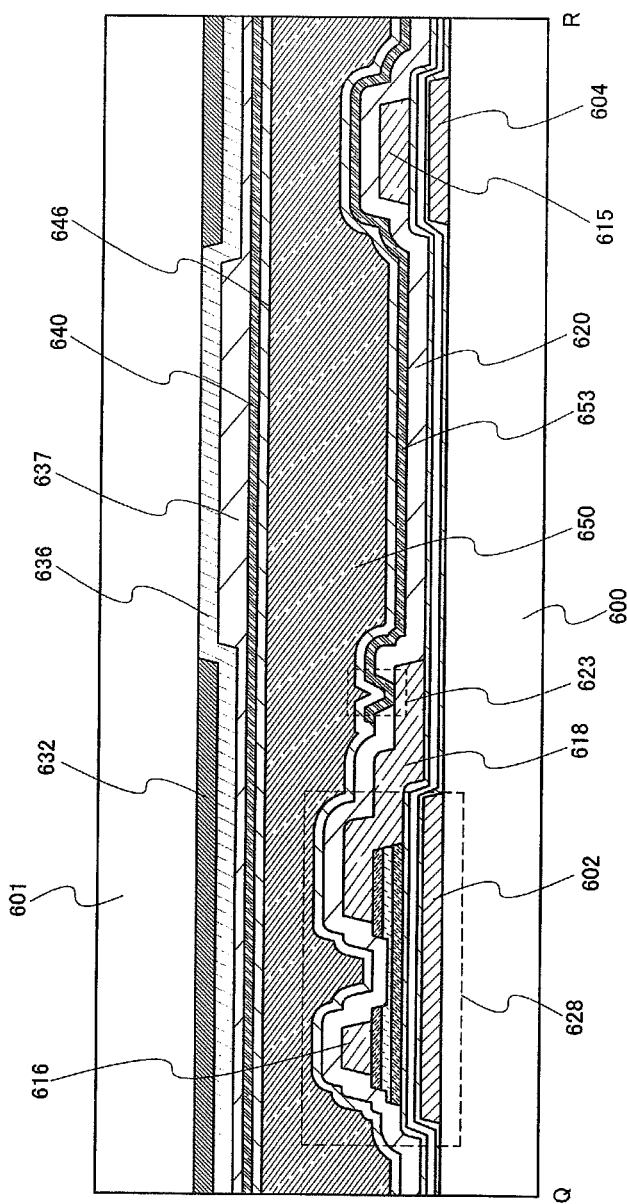
FIG. 25 is a view illustrating an example of a liquid crystal display device.
Figure 26:
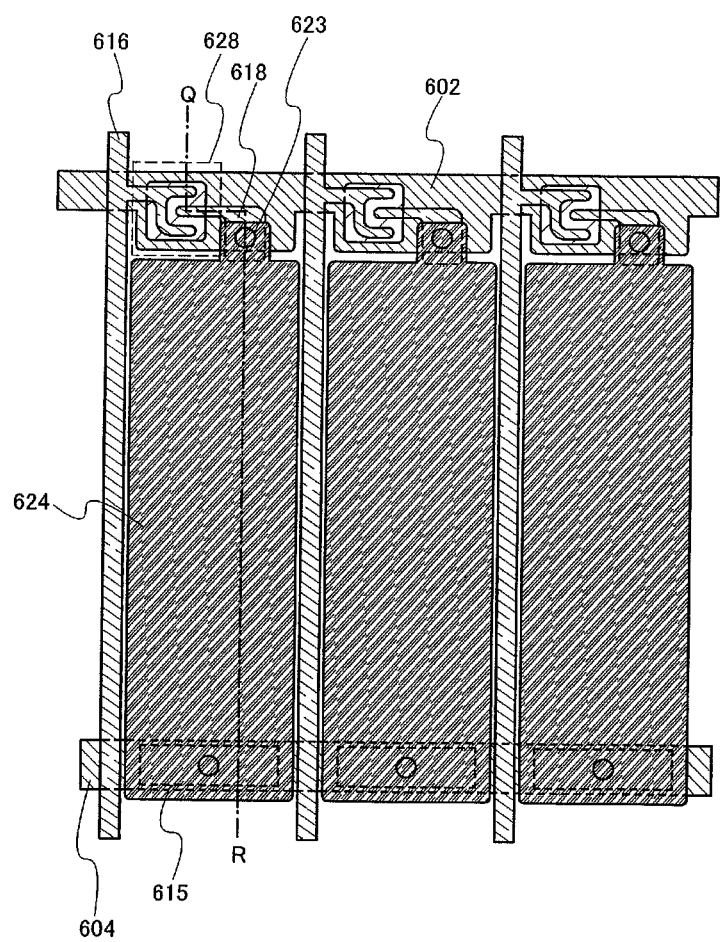
FIG. 26 is a view illustrating an example of a liquid crystal display device.

FIGS. 25 and 26 illustrate a pixel structure of a TN liquid crystal display device. FIG. 26 is a plan view and FIG. 25 illustrates a cross-sectional structure along section line Q-R in FIG. 26. The following description will be made with reference to both drawings.

The pixel electrode 653 is connected to the thin film transistor 628 through a wiring 618, in a contact hole 623. The wiring 616 functioning as a data line is connected to the thin film transistor 628. Any of the thin film transistors described in Embodiment Modes 1 to 5 can be applied to the thin film transistor 628 and the thin film transistor described in Embodiment Mode 1 is applied in FIG. 25.

The pixel electrode 653 is formed using the pixel electrode 77 described in Embodiment Mode 1.

A counter substrate 601 is provided with the light-shielding film 632, a coloring film 636, and a counter electrode 640. Further, a planarization film 637 is formed between the coloring film 636 and the counter electrode 640 to prevent alignment disorder of the liquid crystals. The liquid crystal layer 650 is formed between the pixel electrode 653 and the counter electrode 640.

Further, a polarizing plate is attached to a reverse surface of a surface of the substrate 600, on which the thin film transistor is formed. Further, a polarizing plate is attached to a reverse surface of a surface of the counter substrate 601, on which the counter electrode 640 is formed.

The counter electrode 640 can be formed using a material similar to that of the pixel electrode 653 as appropriate. The pixel electrode 653, the liquid crystal layer 650, and the counter electrode 640 are overlapped with one another, so that a liquid crystal element is formed.

Through the above steps, the liquid crystal display device can be manufactured. Since a thin film transistor with excellent electric characteristics is used for the liquid crystal display device of this embodiment mode, the liquid crystal display device has high contrast and high visibility.

(Embodiment Mode 7)

In this embodiment mode, a light-emitting device, which is one mode of a display device, will be described with reference to FIGS. 9A and 9B, FIGS. 10A to 10C, FIGS. 11A and 11B, FIGS. 27A and 27B, and FIGS. 28A to 28C. Here, a light-emitting device using a light-emitting element utilizing electroluminescence will be described. Light-emitting elements utilizing electroluminescence are classified according to whether a light-emitting material is an organic compound or an inorganic compound. In general, the former and the latter are referred to as an organic EL element and an inorganic EL element, respectively. A YSZ film has a light-transmitting property and a method for displaying images by transmitting light through this film is also possible.

In an organic EL element, by applying a voltage to a light-emitting element, electrons and holes are separately injected from a pair of electrodes into a layer containing a light-emitting organic compound, and thus a current flows. The carriers (electrons and holes) are recombined and thus, the light-emitting organic compound is excited. The light-emitting organic compound returns to a ground state from the excited state, thereby emitting light. Owing to such a mechanism, such a light-emitting element is referred to as a current-excitation light-emitting element.

Inorganic EL elements are classified according to the element structures into a dispersion inorganic EL elements and thin-film inorganic EL elements. A dispersion inorganic EL element includes a light-emitting layer where particles of a light-emitting material are dispersed in a binder, and its light emission mechanism is donor-acceptor recombination light emission utilizing a donor level and an acceptor level. A thin-film inorganic EL element has a structure in which a light-emitting layer is sandwiched between dielectric layers, which are further sandwiched between electrodes, and its light emission mechanism is localized light emission utilizing inner-shell electron transition of metal ions. Note that description is made here using an organic EL element as the light-emitting element. Further, the thin film transistor described in Embodiment Mode 1 is used as a thin film transistor which controls driving of the light-emitting element. In a light-emitting device using the thin film transistor obtained according to Embodiment Mode 1, fluctuation in threshold voltage of the thin film transistor can be suppressed, which leads to improvement in reliability. In particular, the thin film transistor described in Embodiment Mode 1 including a gate insulating film with a three-layer structure in which a silicon nitride film, a silicon oxynitride film, and a YSZ film are formed for a first layer, a second layer, and a third layer, respectively, may be applied so that the thin film transistor used for the light emitting device is driven by DC drive. The thin film transistor of Embodiment Mode 1 can suppress a drift of the threshold voltage mainly by the silicon oxynitride film in the second layer.

Through the process of FIGS. 9A and 9B, FIGS. 10A to 10C, and FIGS. 11A and 11B, as illustrated in FIGS. 27A and 27B, a thin film transistor 83 is formed over a substrate 50 having an insulating surface, and an insulating film 76 functioning as a protective film is formed over the thin film transistor 83. Further, a thin film transistor 84 is formed for a driver circuit 12. The thin film transistor 84 can be formed in the same manufacturing process as the thin film transistor 83 in a pixel portion 11. Then, a planarization film 93 is formed over the insulating film 76, and a pixel electrode 94 connected to a source or drain electrode of the thin film transistor 83 is formed over the planarization film 93.

The planarization film 93 is preferably formed using an organic resin such as acrylic, polyimide, or polyamide, or siloxane.

In FIG. 27A, a thin film transistor in the pixel portion 11 is an n-channel thin film transistor. Thus, a cathode is desirably used as the pixel electrode 94. On the contrary, in the case where the thin film transistor is a p-channel thin film transistor, an anode is desirably used. Specifically, for the cathode, a known material with a low work function, such as calcium, aluminum, calcium fluoride, a silver magnesium alloy, or an aluminum-lithium alloy, can be used.

Then, as illustrated in FIG. 27B, a partition wall 91 is formed over the planarization film 93 and an end portion of the pixel electrode 94. The partition wall 91 has an opening portion through which the pixel electrode 94 is exposed. The partition wall 91 is formed using an organic resin film, an inorganic insulating film, or organic polysiloxane. It is particularly preferable that the partition wall 91 be formed of a photosensitive material, and the opening portion be formed over the pixel electrode so that a side wall of the opening portion forms an inclined surface with a continuous curvature.

Then, a light-emitting layer 95 is formed in contact with the pixel electrode 94 in the opening portion of the partition wall 91. The light-emitting layer 95 may have a single-layer structure or a layered structure including a plurality of layers.

Then, a common electrode 96 is formed so as to cover the light-emitting layer 95. The common electrode 96 can be formed of a light-transmitting conductive film using any of the light-transmitting conductive materials listed in Embodiment Mode 1 for the pixel electrode 77. As the common electrode 96, a titanium nitride film or a titanium film may be used in addition to the above light-transmitting conductive film. In FIG. 27B, indium tin oxide is used as the common electrode 96. In the opening portion of the partition wall 91, the pixel electrode 94, the light-emitting layer 95, and the common electrode 96 are overlapped with one another, so that a light-emitting element 98 is formed. After that, it is preferable that a protective film 97 be formed over the common electrode 96 and the partition wall 91 so that oxygen, hydrogen, moisture, carbon dioxide, or the like does not enter the light-emitting element 98. As the protective film 97, a silicon nitride film, a silicon nitride oxide film, a DLC film, or the like can be formed.

Note that although not illustrated, after the steps up to the step of FIG. 27B are completed, it is preferable that packaging (sealing) be further performed using a protective film (a laminated film, an ultraviolet curable resin film, or the like), or a cover material, which has high airtightness and causes less degasification, in order to prevent exposure to the air.

Next, a structure of a light-emitting element will be described with reference to FIGS. 28A to 28C. Here, cross-sectional structures of pixels are described taking the case where a driving thin film transistor is an n-channel transistor, as an example.

In order to take out light emission of a light-emitting element, at least one of an anode and a cathode is required to be transparent. There are light-emitting elements having a top emission structure in which light emission is extracted through the surface opposite to the substrate, a bottom emission structure in which light emission is extracted through the surface on the substrate side, and a dual emission structure in which light emission is extracted through the surface opposite to the substrate and the surface on the substrate side. The pixel structure of the present invention can be applied to a light-emitting element having any of these emission structures.

A light-emitting element having a top emission structure will be described with reference to FIG. 28A.

Figure 28A:
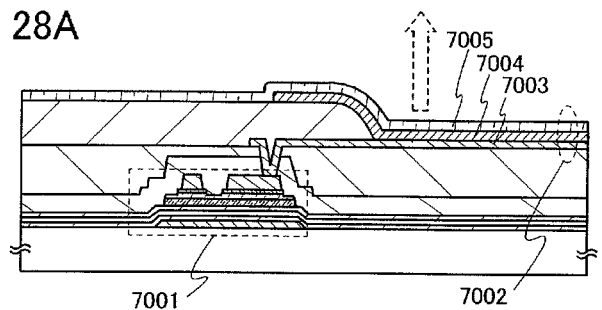
FIGS. 28A to 28C are cross-sectional views each illustrating a pixel applicable to a light-emitting device.

FIG. 28A is a cross-sectional view of a pixel in which a driving thin film transistor 7001 is an n-channel thin film transistor and light generated in a light-emitting element 7002 is emitted to pass through an anode 7005. In FIG. 28A, a cathode 7003 of the light-emitting element 7002 and the driving thin film transistor 7001 are electrically connected to each other, and an EL layer 7004 and the anode 7005 are stacked in this order over the cathode 7003. As the cathode 7003, a known conductive film can be used as long as it has a low work function and reflects light. For example, calcium, aluminum, calcium fluoride, a silver magnesium alloy, or an aluminum-lithium alloy is desirably used. Further, the EL layer 7004 may have a single-layer structure or a layered structure including a plurality of layers. When the light-emitting layer 7004 is formed using a plurality of layers, the EL layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 may be formed using a light-transmitting conductive material. For example, indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

The light-emitting element 7002 corresponds to a region where the cathode 7003 and the anode 7005 sandwich the EL layer 7004. In the case of the pixel illustrated in FIG. 28A, light generated in the light-emitting element 7002 is emitted to pass through the anode 7005 as shown by an outline arrow.

Next, a light-emitting element having a bottom emission structure will be described with reference to FIG. 28B. FIG. 28B is a cross-sectional view of a pixel in the case where a driving thin film transistor 7011 is an n-channel transistor and light generated in a light-emitting element 7012 is emitted to pass through a cathode 7013. In FIG. 28B, the cathode 7013 of the light-emitting element 7012 is formed over a light-transmitting conductive film 7017 which is electrically connected to the driving thin film transistor 7011, and an EL layer 7014 and an anode 7015 are stacked in this order over the cathode 7013. Note that a light-shielding film 7016 for reflecting or shielding light may be formed so as to cover the anode 7015 when the anode 7015 has a light-transmitting property. For the cathode 7013, a known conductive film can be used as in the case of FIG. 28A as long as it has a low work function. It is to be noted that the cathode 7013 is formed to have a thickness small enough that light can be transmitted (preferably, approximately 5 to 30 nm). For example, Al having a thickness of 20 nm can be used for the cathode 7013. Further, the EL layer 7014 may have a single-layer structure or a layered structure including a plurality of layers as in the case of FIG. 28A. The anode 7015 does not necessarily transmit light, but can be formed using a conductive material having a light-transmitting property as in the case of FIG. 28A. Further, as the light-shielding film 7016, a metal or the like that reflects light can be used; however, it is not limited to a metal film. For example, a resin or the like to which black pigments are added may be used.

The light-emitting element 7012 corresponds to a region where the cathode 7013 and the anode 7015 sandwich the EL layer 7014. In the case of the pixel illustrated in FIG. 28B, light generated in the light-emitting element 7012 is emitted to pass through the cathode 7013 as shown by an outline arrow.

Next, a light-emitting element having a dual emission structure will be described with reference to FIG. 28C. In FIG. 28C, a cathode 7023 of a light-emitting element 7022 is formed over a light-transmitting conductive material 7027 which is electrically connected to a driving thin film transistor 7021, and an EL layer 7024 and an anode 7025 are stacked in this order over the cathode 7023. For the cathode 7023, a known conductive film can be used as in the case of FIG. 28A as long as it has a low work function. It is to be noted that the cathode 7023 is formed to have a thickness small enough that light can be transmitted. For example, Al having a thickness of 20 nm can be used for the cathode 7023. Further, the EL layer 7024 may have a single-layer structure or a layered structure including a plurality of layers as in the case of FIG. 28A. The anode 7025 can be formed using a light-transmitting conductive material as in the case of FIG. 28A.

The light-emitting element 7022 corresponds to a portion where the cathode 7023, the anode 7025, and the EL layer 7024 are overlapped with one another. In the case of a pixel illustrated in FIG. 28C, light generated in the light-emitting element 7022 is emitted to pass through both the anode 7025 and the cathode 7023 as shown by outline arrows.

Note that, although an organic EL element is described here as a light-emitting element, an inorganic EL element may be provided as the light-emitting element.

Note that in this embodiment mode, an example in which a thin film transistor for controlling the driving of a light-emitting element (the driving thin film transistor) is electrically connected to the light-emitting element is described; however, a thin film transistor for controlling a current may be connected between the driving thin film transistor and the light-emitting element.

Figure 28B:
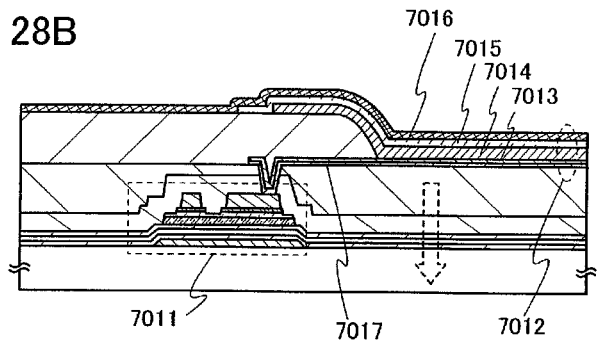
Figure 28C:
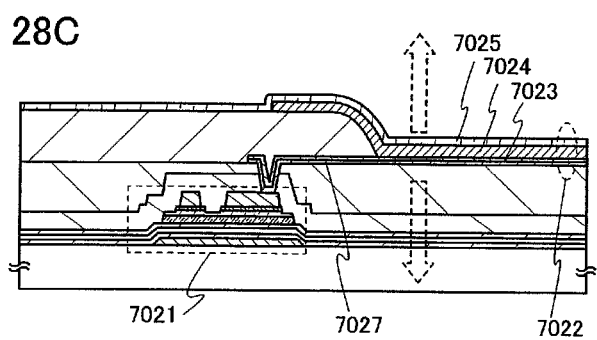

Note that the light-emitting device described in this embodiment mode is not limited to the structures illustrated in FIGS. 28A to 28C and can be modified in various ways based on the spirit of techniques according to the present invention.

Through the above process, a light-emitting device can be manufactured. Since a thin film transistor with excellent electric characteristics is used for the light-emitting device of this embodiment mode, the light-emitting device has high contrast and high visibility.

(Embodiment Mode 8)

The structure of a display panel which is one mode of the display device of the present invention will be described below.

Figure 29A:
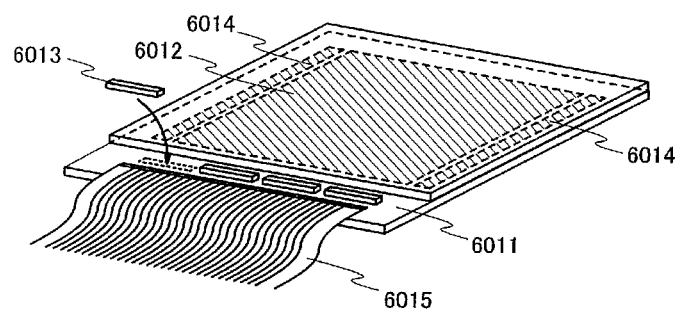
FIGS. 29A to 29C are perspective views each illustrating a display panel.

FIG. 29A illustrates a mode of a display panel in which a signal line driver circuit 6013 which is separately formed is connected to a pixel portion 6012 formed over a substrate 6011. The pixel portion 6012 and a scan line driver circuit 6014 are each formed using a thin film transistor which uses a microcrystalline semiconductor film. By forming the signal line driver circuit with the use of a thin film transistor by which higher mobility can be obtained as compared to the thin film transistor including the microcrystalline semiconductor film, the operation of the signal line driver circuit, which demands a higher driving frequency than that of the scan line driver circuit, can be stabilized. Note that the signal line driver circuit 6013 may be formed using a thin film transistor including a single crystal semiconductor, a thin film transistor including a polycrystalline semiconductor, or a thin film transistor including an SOI. A potential of a power source, various signals, and the like are supplied to the pixel portion 6012, the signal line driver circuit 6013, and the scan line driver circuit 6014 through an FPC 6015.

Note that both the signal line driver circuit and the scan line driver circuit may be formed over the same substrate as that of the pixel portion.

Figure 29B:
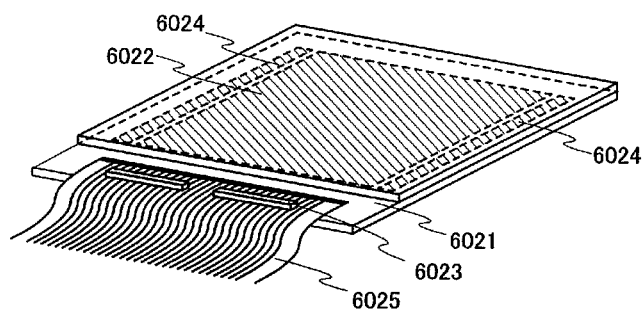

Further, when the driver circuit is separately formed, a substrate provided with the driver circuit is not necessarily attached to a substrate provided with the pixel portion and may be attached to, for example, the FPC. FIG. 29B illustrates a mode of a panel of a liquid crystal display device, in which a signal line driver circuit 6023 which is separately formed is connected to a pixel portion 6022 and a scan line driver circuit 6024 which are formed over a substrate 6021. The pixel portion 6022 and the scan line driver circuit 6024 are each formed using a thin film transistor which uses a microcrystalline semiconductor film. The signal line driver circuit 6023 is connected to the pixel portion 6022 with an FPC 6025 interposed therebetween. The pixel portion 6022, the signal line driver circuit 6023, and the scan line driver circuit 6024 are each supplied with a potential of a power source, a variety of signals, and the like through the FPC 6025.

Figure 29C:
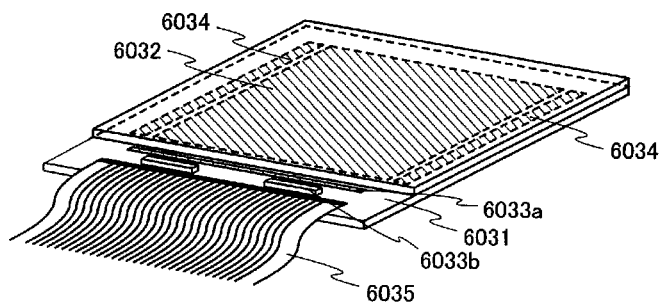

Alternatively, part of the signal line driver circuit or part of the scan line driver circuit may be formed over the same substrate as that of the pixel portion with the use of the thin film transistor which uses a microcrystalline semiconductor film, and the rest may be formed separately and electrically connected to the pixel portion. FIG. 29C illustrates a mode of a liquid crystal display device panel in which an analog switch 6033a included in the signal line driver circuit is formed over a substrate 6031, over which a pixel portion 6032 and a scan line driver circuit 6034 are formed, and a shift register 6033b included in the signal line driver circuit is formed separately over a different substrate and then attached to the substrate 6031. The pixel portion 6032 and the scan line driver circuit 6034 are each formed using the thin film transistor which uses a microcrystalline semiconductor film. The shift resistor 6033b included in the signal line driver circuit is connected to the pixel portion 6032 with an FPC 6035 interposed therebetween. A potential of a power source, various signals, and the like are each supplied to the pixel portion 6032, the signal line driver circuit, and the scan line driver circuit 6034 through the FPC 6035.

As illustrated in FIGS. 29A to 29C, in a liquid crystal display device of the present invention, all or a part of the driver circuit can be formed over the same substrate as that of the pixel portion with the use of the thin film transistor which uses a microcrystalline semiconductor film.

Note that there are no particular limitations on a connecting method of a separately formed substrate, and a known method such as a COG method, a wire bonding method, or a TAB method can be used. Further, a connection position is not limited to the position illustrated in each of FIGS. 29A to 29C as long as electrical connection is possible. Further, a controller, a CPU, a memory, or the like may be formed separately and connected.

Note that a signal line driver circuit used in the present invention is not limited to a mode including only a shift resistor and an analog switch. In addition to the shift resistor and the analog switch, another circuit such as a buffer, a level shifter, or a source follower may be included. Further, the shift resistor and the analog switch are not necessarily provided. For example, a different circuit such as a decoder circuit by which selection of a signal line is possible may be used instead of the shift resistor, and a latch or the like may be used instead of the analog switch.

Figure 32:
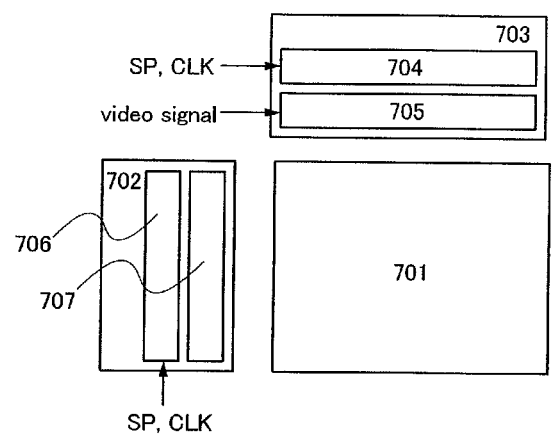
FIG. 32 is a block diagram illustrating a structure of a light-emitting device.

FIG. 32 is a block diagram of the liquid crystal display device of the present invention. The display device illustrated in FIG. 32 includes a pixel portion 701 including a plurality of pixels each provided with a display element; a scan line driver circuit 702 which selects each pixel; and a signal line driver circuit 703 which controls a video signal input to a selected pixel.

In FIG. 32, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704, and the timing signal is input to the analog switch 705.

Further, a video signal is input to the analog switch 705. The analog switch 705 samples the video signal according to the input timing signal and supplies the video signal to the signal line of a next stage.

Next, a configuration of the scan line driver circuit 702 is described. The scan line driver circuit 702 includes a shift register 706 and a buffer 707. Further, a level shifter may be included in some cases. In the scan line driver circuit 702, by inputting a clock signal (CLK) and a start pulse signal (SP) to the shift register 706, a selection signal is generated. The generated selection signal is buffered and amplified in the buffer 707 and then supplied to a corresponding scan line. Gates of transistors in pixels of one line are connected to the scan line. Further, since the transistors in the pixels of one line are required to be turned on concurrently, a buffer to which a large current can be fed is used as the buffer 707.

In a full color liquid crystal display device, in the case where video signals corresponding to R (red), G (green), and B (blue) are sequentially sampled and supplied to a corresponding signal line, the number of terminals for connecting the shift register 704 and the analog switch 705 corresponds to approximately one third of the number of terminals for connecting the analog switch 705 and the signal line in the pixel portion 701. Thus, by forming the analog switch 705 and the pixel portion 701 over one substrate, the number of terminals used for connecting a substrate over which a pixel portion is formed to a substrate which is formed separately can be reduced, occurrence probability of disconnection can be suppressed, and yield can be increased, as compared to a case of forming the analog switch 705 and the pixel portion 701 over different substrates.

Note that although the scan line driver circuit 702 in FIG. 32 includes the shift register 706 and the buffer 707, the scan line driver circuit 702 may be formed of only the shift register 706.

Note that the structure illustrated in FIG. 32 is merely a mode of the display device of the present invention, and the structures of a signal line driver circuit and a scan line driver circuit are not limited thereto. In a liquid crystal display device including the circuit illustrated in FIG. 32 including a transistor using a microcrystalline semiconductor, the circuit can be operated at high speed. For example, mobility of a transistor using a microcrystalline semiconductor film is higher than that of a transistor using an amorphous semiconductor film; therefore, a driving frequency of a driver circuit (for example, the shift register 706 in the scan line driver circuit 702) can be increased. Since the scan line driver circuit 702 can be operated at high speed, a frame frequency can be increased or black frame insertion can be realized, for example.

When the frame frequency is increased, data for a screen is preferably generated in accordance with a direction of movement of an image. That is, motion compensation is preferably performed to interpolate data. Thus, the frame frequency is increased and image data is interpolated, so that display characteristics of moving images are improved, and smooth display can be performed. For example, when frame frequency is double (for example, 120 Hz or 100 Hz) or more, and preferably fourfold (for example, 480 Hz or 400 Hz) or more, blurring and afterimages of moving images can be reduced. In that case, the driving frequency of the scan line driver circuit 702 is also increased to be operated and thus, the frame frequency can be increased.

When black frame insertion is performed, such a structure is employed in which image data or data for black display can be supplied to the pixel portion 701. Thus, display is closer to that of impulse driving, and afterimages can be reduced. In that case, the driving frequency of the scan line driver circuit 702 is also increased to be operated and thus, black frame insertion can be performed.

Further, the channel width of the transistor in the scan line driver circuit 702 is increased or a plurality of scan line driver circuits are provided, for example, so that higher frame frequency can be realized. For example, frame frequency can be eightfold (for example, 960 Hz or 800 Hz) or more. In the case where a plurality of scan line driver circuits are provided, a scan line driver circuit for driving even-numbered scan lines is provided on one side and a scan line driver circuit for driving odd-numbered scan lines is provided on the opposite side; thus, frame frequency can be increased.

Note that the circuit illustrated in FIG. 32 is formed using a thin film transistor which uses a microcrystalline semiconductor, and thus the layout area can be reduced. Accordingly, the area of a frame of a liquid crystal display device, which is an example of the display device, can be reduced. For example, mobility of the thin film transistor using a microcrystalline semiconductor film is higher than that of a transistor using an amorphous semiconductor film; therefore, the channel width of the transistor can be reduced. Accordingly, a frame of the liquid crystal display device can be narrowed.

(Embodiment Mode 9)

Figure 33A:
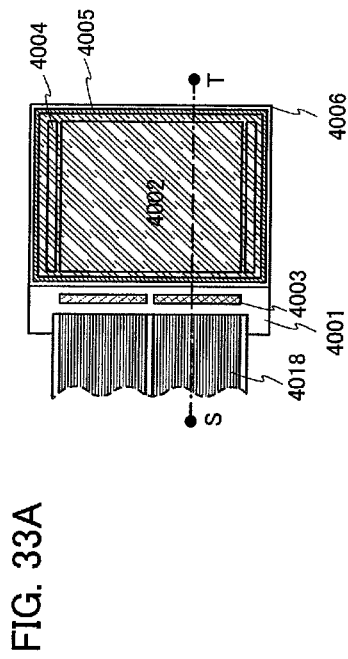
FIG. 33A is a top view illustrating a display panel and FIG. 33B is a cross-sectional view illustrating the display panel.
Figure 33B:
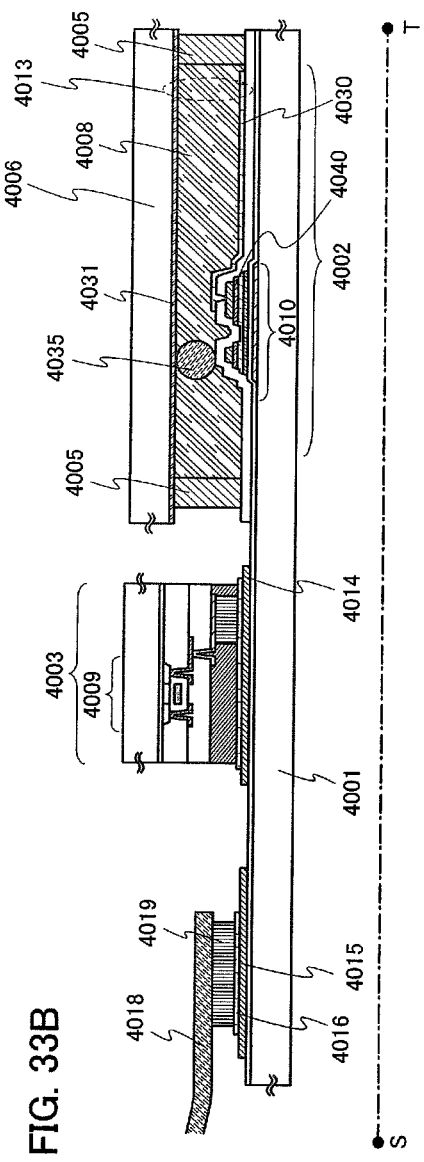

The appearance and the cross section of a liquid crystal display panel which corresponds to one mode of the display device of the present invention will be described with reference to FIGS. 33A and 33B. FIG. 33A is a top view of a panel where a thin film transistor 4010 using a microcrystalline semiconductor film and a liquid crystal element 4013 which are formed over a first substrate 4001 are sealed between the first substrate 4001 and a second substrate 4006 with a sealing material 4005. FIG. 33B is a cross-sectional view taken along S-T in FIG. 33A.

The sealing material 4005 is provided so as to surround a pixel portion 4002 and a scan line driver circuit 4004 which are provided over the first substrate 4001. A second substrate 4006 is provided over the pixel portion 4002 and the scan line driver circuit 4004. Therefore, the pixel portion 4002 and the scan line driver circuit 4004 are sealed, together with liquid crystal 4008, between the first substrate 4001 and the second substrate 4006 with the sealing material 4005. A signal line driver circuit 4003 formed using a polycrystalline semiconductor film over a substrate, which is prepared separately, is mounted on a region different from the region surrounded by the sealing material 4005 over the first substrate 4001. Note that this embodiment mode will describe an example in which the signal line driver circuit 4003 including a thin film transistor formed using a polycrystalline semiconductor film is attached to the first substrate 4001. Alternatively, a signal line driver circuit including a thin film transistor using a single-crystalline semiconductor film may be attached to the first substrate 4001. FIGS. 33A and 33B illustrate a thin film transistor 4009 formed using a polycrystalline semiconductor film, which is included in the signal line driver circuit 4003.

Further, each of the pixel portion 4002 and the scan line driver circuit 4004 which are provided over the first substrate 4001 includes a plurality of thin film transistors. FIG. 33B illustrates the thin film transistor 4010 included in the pixel portion 4002, as an example. The thin film transistor 4010 corresponds to a thin film transistor using a microcrystalline semiconductor film.

Further, reference numeral 4013 denotes a liquid crystal element. A pixel electrode 4030 of the liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a portion where the pixel electrode 4030, the counter electrode 4031, and the liquid crystal 4008 are overlapped with one another.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

A spherical spacer 4035 is provided to control a distance (cell gap) between the pixel electrode 4030 and the counter electrode 4031. Note that a spacer obtained by selective etching of an insulating film may be used.

Further, a variety of signals and a potential are supplied to the signal line driver circuit 4003 which is formed separately, the scan line driver circuit 4004, and the pixel portion 4002 through lead wirings 4014 and 4015 from an FPC 4018.

In this embodiment mode, a connecting terminal 4016 is formed of the same conductive film as the pixel electrode 4030 included in the liquid crystal element 4013. Further, the lead wirings 4014 and 4015 are formed using the same conductive film as the wiring 4040.

The connecting terminal 4016 is electrically connected to a terminal of an FPC 4018 with an anisotropic conductive film 4019 interposed therebetween.

Note that although not illustrated, a liquid crystal display device described in this embodiment mode includes an alignment film and a polarizing plate and may also include a color filter.

Further, FIGS. 33A and 33B illustrate an example in which the signal line driver circuit 4003 is separately formed and mounted on the first substrate 4001; however, this embodiment mode is not limited to this structure. The scan line driver circuit may be separately formed and then mounted, or only part of the signal line driver circuit or part of the scan line driver circuit may be separately formed and then mounted.

This embodiment mode can be implemented in combination with any of the structures described in the other embodiment modes.

(Embodiment Mode 10)

Next, the appearance and the cross section of a light-emitting display panel corresponding to one mode of the display device of the present invention will be described with reference to FIGS. 34A and 34B. FIG. 34A is a top view of a panel where a light-emitting element and a thin film transistor using a microcrystalline semiconductor film, which are formed over a first substrate, are sealed between the first substrate and a second substrate with a sealing material. FIG. 34B corresponds to a cross-sectional view along U-V in FIG. 34A.

The sealing material 4005 is provided so as to surround the pixel portion 4002 and the scan line driver circuit 4004 which are provided over the first substrate 4001. Further, the second substrate 4006 is provided over the pixel portion 4002 and the scan line driver circuit 4004. Thus, the pixel portion 4002 and the scan line driver circuit 4004 are sealed, together with a filler 4007, between the first substrate 4001 and the second substrate 4006 with the sealing material 4005. Further, the signal line driver circuit 4003 formed using a polycrystalline semiconductor film over a substrate, which is prepared separately, is mounted on a region different from the region surrounded by the sealing material 4005 over the first substrate 4001. Note that this embodiment mode will describe an example in which the signal line driver circuit 4003 including a thin film transistor formed using a polycrystalline semiconductor film is attached to the first substrate 4001. Alternatively, a signal line driver circuit including a thin film transistor using a single-crystalline semiconductor film may be attached to the first substrate 4001. FIG. 34B illustrates a thin film transistor 4009 formed using a polycrystalline semiconductor film, which is included in the signal line driver circuit 4003.

Each of the pixel portion 4002 and the scan line driver circuit 4004 which are provided over the first substrate 4001 includes a plurality of thin film transistors. FIG. 34B illustrates the thin film transistor 4010 included in the pixel portion 4002 as an example. Note that in this embodiment mode, it is assumed that the thin film transistor 4010 is a driving thin film transistor but may also be a current control thin film transistor or an erasing thin film transistor. The thin film transistor 4010 corresponds to a thin film transistor using a microcrystalline semiconductor film.

Further, reference numeral 4011 denotes a light-emitting element. A pixel electrode of the light-emitting element 4011 is electrically connected to a source or drain electrode of the thin film transistor 4010 through a wiring 4017. In this embodiment mode, a common electrode of the light-emitting element 4011 and a transparent conductive film 4012 are electrically connected to each other. Note that the structure of the light-emitting element 4011 is not limited to that described in this embodiment mode. The structure of the light-emitting element 4011 can be changed as appropriate depending on an extraction direction of light from the light-emitting element 4011 or a polarity of the thin film transistor 4010.

Although not illustrated in the cross-sectional view of FIG. 34B, a variety of signals and a potential are supplied to the formed signal line driver circuit 4003 which is formed separately, the scan line driver circuit 4004, and the pixel portion 4002 through the lead wirings 4014 and 4015 from the FPC 4018.

In this embodiment mode, the connecting terminal 4016 is formed of the same conductive film as the pixel electrode included in the light-emitting element 4011. Further, the lead wirings 4014 and 4015 are formed of the same conductive film as the wiring 4017.

The connecting terminal 4016 is electrically connected to a terminal of the FPC 4018 with the anisotropic conductive film 4019 interposed therebetween.

The second substrate located in the direction in which light is extracted from the light-emitting element 4011 is required to be transparent. In that case, a material with a light-transmitting property, such as a glass plate, a plastic plate, a polyester film, or an acrylic film is used.

Further, as the filler 4007, an ultraviolet curable resin or a heat curable resin, such as PVC (polyvinyl chloride), acrylic, polyimide, an epoxy resin, a silicone resin, PVB (polyvinyl butyral), or EVA (ethylene vinyl acetate), can be used as well as an inert gas such as nitrogen or argon. In this embodiment mode, nitrogen is used as the filler.

If needed, an optical film such as a polarizing plate, a circular polarizing plate (including an elliptical polarizing plate), a retardation plate (a quarter-wave plate or a half-wave plate), or a color filter may be provided as appropriate on an emission surface of the light-emitting element. Further, a polarizing plate or a circular polarizing plate may be provided with an anti-reflection film. For example, anti-glare treatment by which reflected light can be diffused by projections and depressions on a surface and thus, reflection can be reduced may be performed.

Note that FIGS. 34A and 34B illustrate an example in which the signal line driver circuit 4003 is separately formed and mounted on the first substrate 4001; however, this embodiment mode is not limited to this structure. The scan line driver circuit may be formed separately and then mounted, or only a part of the signal line driver circuit or a part of the scan line driver circuit may be formed separately and then mounted.

This embodiment mode can be combined with any of the structures described in the other embodiment modes.

(Embodiment Mode 11)

Display devices or the like obtained by the present invention can be used for modules of active matrix display devices. That is, the present invention can be implemented in all electronic appliances in which these modules are incorporated into display portions.

As examples of such electronic appliances, the following can be given: cameras such as video cameras and digital cameras, head-mounted displays (goggle-type displays), car navigation systems, projectors, car stereos, personal computers, and portable information terminals (for example, mobile computers, cellular phones, and e-book readers). FIGS. 30A to 30D illustrate examples of such electronic appliances.

Figure 30A:
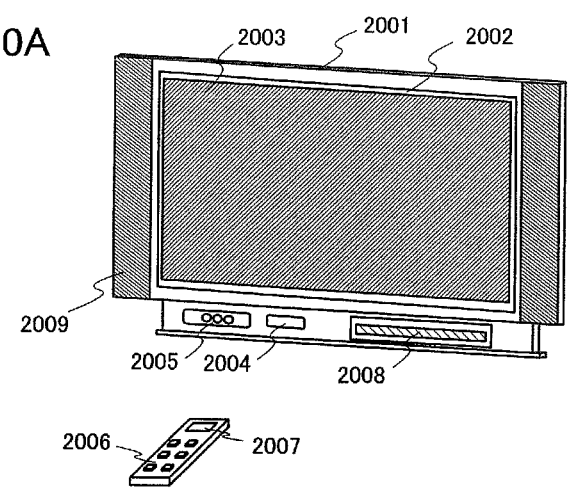
FIGS. 30A to 30D are perspective views each illustrating an electronic appliance using a light-emitting device.

FIG. 30A illustrates a television device. The television device can be completed by incorporating a display module into a housing as illustrated in FIG. 30A. A display panel provided with components up to an FPC is also referred to as a display module. A main display screen 2003 is formed using the display module, and speaker portions 2009, an operation switch, and the like are provided as its accessory equipment. Thus, a television device can be completed.

As illustrated in FIG. 30A, a display panel 2002 including a display element is incorporated into a housing 2001. In addition to reception of general television broadcast by a receiver 2005, communication of data in one direction (from a transmitter to a receiver) or in two directions (between a transmitter and a receiver or between receivers) can be performed by connection to a wired or wireless communication network through a modem 2004. Operations of the television device can be performed using switches incorporated into the housing or by a remote control device 2006 provided separately, and a display portion 2007 that displays data output to this remote control device may be provided for the remote control device 2006.

Further, the television device may also include a sub screen 2008 formed using a second display panel to display channels, volume, or the like, in addition to the main screen 2003. In this structure, the main screen 2003 may be formed with a liquid crystal display panel, and the sub-screen 2008 may be formed with a light-emitting display panel. Further, the main screen 2003 and the sub-screen 2008 may be formed with light-emitting display panels, and the sub-screen 2008 may be capable of flashing on and off.

Figure 31:
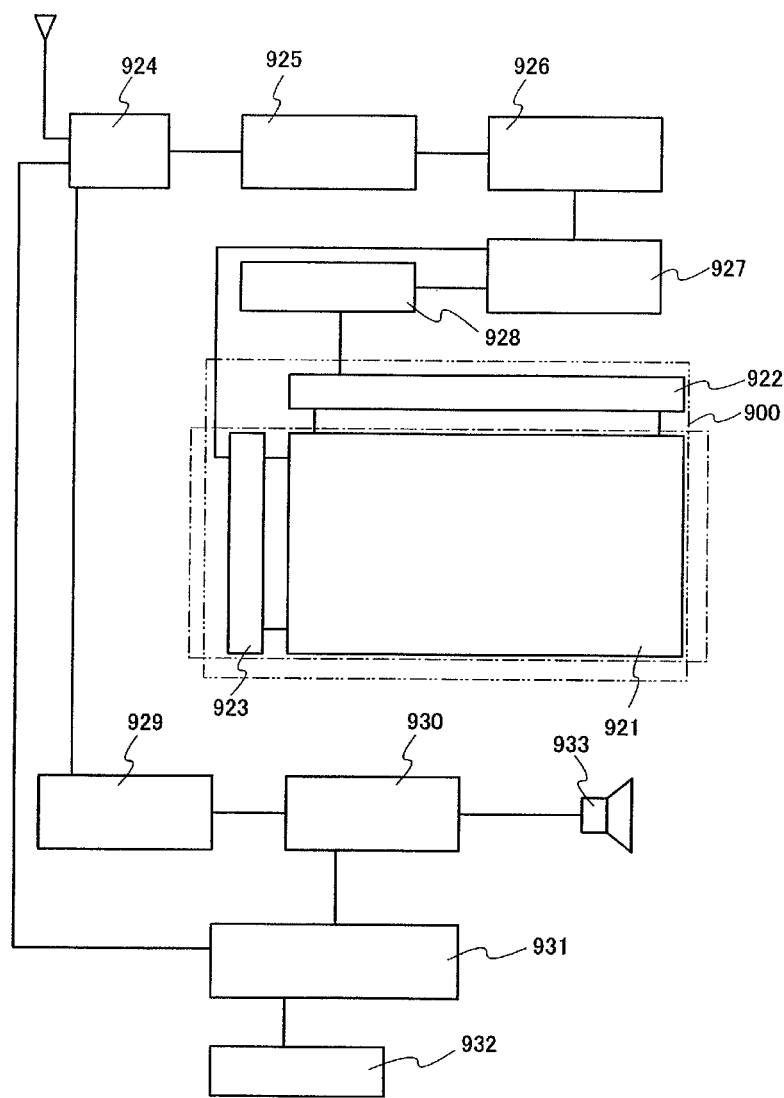
FIG. 31 is a diagram illustrating an electronic appliance using a light-emitting device.

FIG. 31 is a block diagram illustrating a main structure of a television device. A display panel 900 is provided with a pixel portion 921. A signal line driver circuit 922 and a scan line driver circuit 923 may be mounted on the display panel 900 by a COG method.

As structures of other external circuits, a video signal amplifier circuit 925 for amplifying a video signal among signals received by a tuner 924, a video signal processing circuit 926 for converting signals output from the video signal amplifier circuit 925 into chrominance signals corresponding to respective colors of red, green, and blue, a control circuit 927 for converting the video signal into a signal which meets input specifications of a driver IC, and the like are provided on an input side of the video signal. The control circuit 927 outputs signals to each of the scan line side and the signal line side. In the case of digital driving, a signal dividing circuit 928 may be provided on the signal line side and an input digital signal may be divided into in and supplied.

Among the signals received by the tuner 924, an audio signal is transmitted to an audio signal amplifier circuit 929, and an output thereof is supplied to a speaker 933 through an audio signal processing circuit 930. A control circuit 931 receives control data on receiving station (receiving frequency) and volume from an input portion 932 and transmits a signal to the tuner 924 and the audio signal processing circuit 930.

It is needless to say that the present invention is not limited to being used in television devices and can be applied to a variety of applications such as monitors for personal computers and as display media that have a large area, such as information display boards in railway stations, airports, and the like or advertisement display boards on the streets.

Figure 30B:
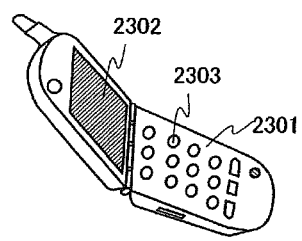

FIG. 30B illustrates an example of a cellular phone 2301. The cellular phone 2301 includes a display portion 2302, an operation portion 2303, and the like. By applying the display device described in any of the above embodiment modes to the display portion 2302, mass productivity can be improved.

Figure 30C:
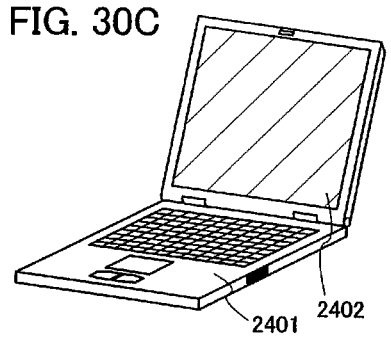

A portable computer shown in FIG. 30C includes a main body 2401, a display portion 2402, and the like. By applying the display device described in any of the above embodiment modes to the display portion 2402, mass productivity can be improved.

Figure 30D:
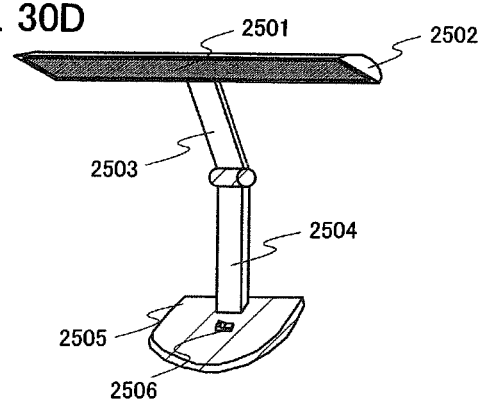

FIG. 30D illustrates a desk lamp including a lighting portion 2501, a lampshade 2502, an adjustable arm 2503, a support 2504, a base 2505, and a power source 2506. The desk lamp is formed using the light-emitting device described in Embodiment Mode 7 for the lighting portion 2501. Note that a lamp includes a ceiling light, a wall light, and the like in its category. By applying the display device described in Embodiment mode 7, mass productivity can be improved and inexpensive desk lamps can be provided.

[Embodiment 1]

This embodiment will describe an experimental result obtained by evaluating crystallinity of a YSZ film in the case where the YSZ film is formed over an noncrystalline base film and a substrate temperature in deposition is a room temperature.

Figure 35:
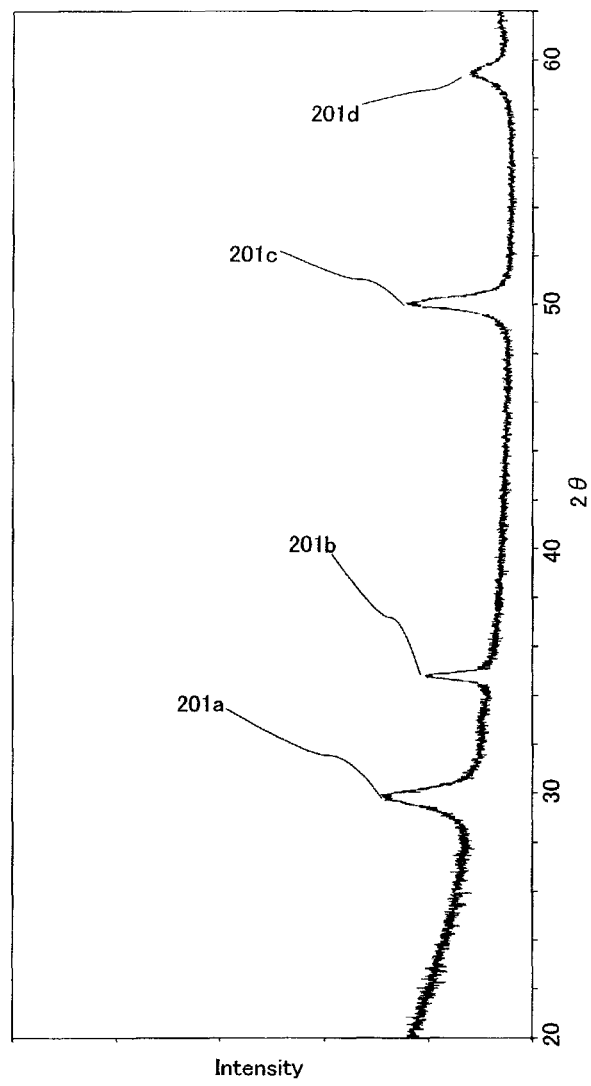
FIG. 35 is an XRD analysis result showing crystallinity of a YSZ film.
Figure 36:
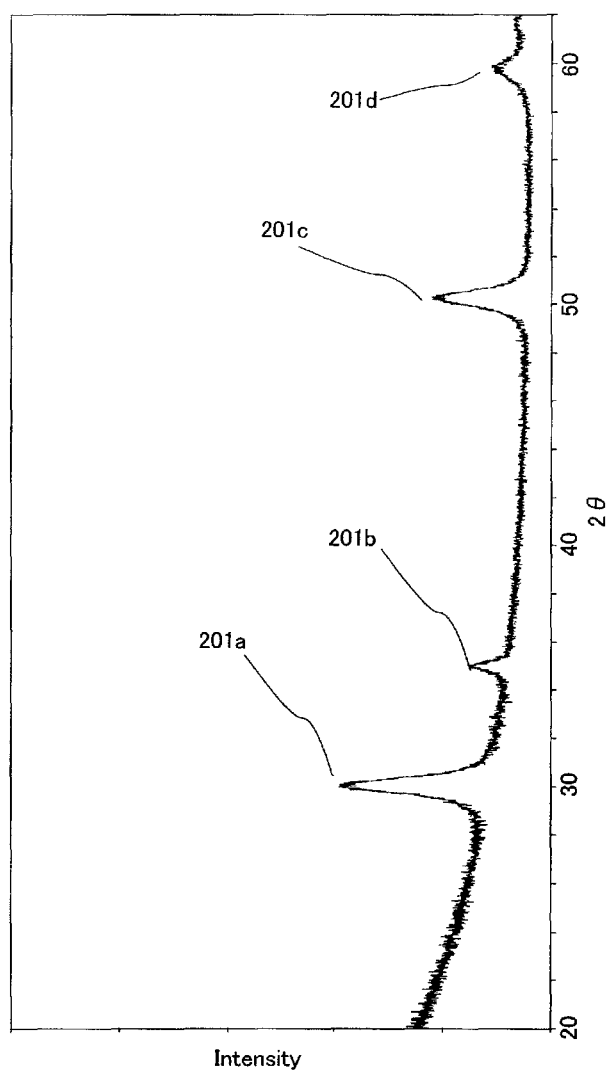
FIG. 36 is an XRD analysis result showing crystallinity of a YSZ film.

FIG. 35 and FIG. 36 are XRD (X-ray diffraction) analysis results showing crystallinity of the YSZ film formed by the present inventors. These are the XRD analysis results of the YSZ film formed to a thickness of 100 nm by a sputtering method using a target in which yttria and zirconia are mixed at a ratio of 8 mol % to 92 mol % over a non-alkali glass substrate which is an noncrystalline base under the conditions that the substrate temperature is a room temperature, deposition gases are argon (Ar) and oxygen (O2), and the deposition pressure is 0.4 Pa.

FIG. 35 shows the XRD analysis result of the YSZ film immediately after deposition of the YSZ film. FIG. 36 shows the XRD analysis result of the YSZ film on which heat treatment is further performed at 550° C. for four hours after deposition of the YSZ film. In both FIG. 35 and FIG. 36, there are a peak 201a of (111) orientation, a peak 201b of (200) orientation, a peak 201c of (220) orientation, and a peak 201d of (311) orientation. Note that common indices at peak positions are denoted by the same reference numerals in both drawings. Under any condition, the (111) orientation and the (220) orientation are prominent.

Thus, even in the case where the base of the YSZ film is the non-alkali glass substrate which is noncrystalline, the YSZ film has crystallinity. That is, in an inverted-staggered thin film transistor, in the case where a YSZ film is formed above silicon oxide or the like, the YSZ film is formed over an noncrystalline insulating film; therefore, it can be said that the YSZ film has crystallinity. In this case, the YSZ film may be formed under the condition that a substrate temperature is a room temperature, and thus it is understood that time for stabilizing the substrate temperature in deposition can be further reduced.

When the YSZ film thus formed is in the uppermost layer of a gate insulating film, a silicon film to be formed on and in contact with the YSZ film can easily be crystallized in a manner specific to silicon, and thus improvement in quality of a semiconductor region, which is an object of the present invention, can be achieved.

This application is based on Japanese Patent Application serial no. 2007-325708 filed with Japan Patent Office on Dec. 18, 2007, the entire contents of which are hereby incorporated by reference.

What is claimed is:

1. A method for manufacturing a semiconductor device, comprising:
   forming a gate electrode over a substrate;
   forming an insulating film containing yttria-stabilized zirconia over the gate electrode;
   forming a microcrystalline semiconductor film on the insulating film containing yttria-stabilized zirconia;
   forming an amorphous semiconductor film over the microcrystalline semiconductor film;
   forming a semiconductor film over the amorphous semiconductor film, the semiconductor film including an impurity element;
   forming an island-like microcrystalline semiconductor film, an island-like amorphous semiconductor film, and an island-like semiconductor film by selective etching of the microcrystalline semiconductor film, the amorphous semiconductor film, and the semiconductor film;

forming source and drain electrodes over the island-like semiconductor film; and forming an opening in the island-like semiconductor film and a depressed portion at a top surface of the island-like amorphous semiconductor film after forming the source and drain electrodes, wherein the opening overlaps with the depressed portion, wherein a width of top edges of the depressed portion is smaller than a distance between bottom edges of the source and drain electrodes, and wherein a direction of the width and a direction of the distance are parallel.

2. The method for manufacturing a semiconductor device, according to claim 1, wherein a surface of the insulating film containing yttria-stabilized zirconia is subjected to plasma treatment using H2, O2, Ar, or N2 or a combination of any of the above.

3. The method for manufacturing a semiconductor device, according to claim 2, wherein the plasma treatment is reverse sputtering treatment.

4. The method for manufacturing a semiconductor device, according to claim 1, wherein the insulating film includes one or a plurality of films selected from the group consisting of a silicon oxide film, a silicon nitride film, a silicon oxynitride film, and a silicon nitride oxide film.

5. The method for manufacturing a semiconductor device, according to claim 1, wherein the microcrystalline semiconductor film is formed under a first deposition condition and a second deposition condition, and wherein a deposition rate of the second deposition condition is higher than that of the first deposition condition.

6. The method for manufacturing a semiconductor device, according to claim 1, wherein the insulating film containing yttria-stabilized zirconia is formed by a sputtering method.

7. A method for manufacturing a semiconductor device, comprising:

forming a gate electrode over a substrate;

forming an insulating film containing yttria-stabilized zirconia over the gate electrode;

forming a microcrystalline semiconductor film on the insulating film containing yttria-stabilized zirconia;

forming an amorphous semiconductor film over the microcrystalline semiconductor film;

forming a semiconductor film over the amorphous semiconductor film, the semiconductor film including an impurity element;

selectively etching the microcrystalline semiconductor film, the amorphous semiconductor film, and the semiconductor film to form a semiconductor layer including a channel formation region over the gate electrode with the insulating film interposed therebetween;

forming source and drain electrodes over the semiconductor layer; and forming a depressed portion at a top surface of the semiconductor layer after forming the source and drain electrodes, wherein a width of top edges of the depressed portion is smaller than a distance between bottom edges of the source and drain electrodes, and wherein a direction of the width and a direction of the distance are parallel.

8. The method for manufacturing a semiconductor device, according to claim 7, wherein a surface of the insulating film containing yttria-stabilized zirconia is subjected to plasma treatment using H2, O2, Ar, or N2 or a combination of any of the above.

9. The method for manufacturing a semiconductor device, according to claim 8, wherein the plasma treatment is reverse sputtering treatment.

10. The method for manufacturing a semiconductor device, according to claim 7, wherein the insulating film includes one or a plurality of films selected from the group consisting of a silicon oxide film, a silicon nitride film, a silicon oxynitride film, and a silicon nitride oxide film.

11. The method for manufacturing a semiconductor device, according to claim 7, wherein the microcrystalline semiconductor film is formed under a first deposition condition and a second deposition condition, and wherein a deposition rate of the second deposition condition is higher than that of the first deposition condition.

12. The method for manufacturing a semiconductor device, according to claim 7, wherein the insulating film containing yttria-stabilized zirconia is formed by a sputtering method.

* * * * *